(12) United States Patent
Lee et al.

(10) Patent No.: US 12,249,390 B2
(45) Date of Patent: *Mar. 11, 2025

(54) MEMORY SYSTEMS WITH VERTICAL INTEGRATION

(71) Applicant: Taiwan Semiconductor Manufacturing Company, Ltd., Hsinchu (TW)

(72) Inventors: Chieh Lee, Hsinchu (TW); Yi-Ching Liu, Hsinchu (TW); Chia-En Huang, Xinfeng Township (TW); Jen-Yuan Chang, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/316,743

(22) Filed: May 12, 2023

(65) Prior Publication Data
US 2023/0282247 A1    Sep. 7, 2023

Related U.S. Application Data

(63) Continuation of application No. 17/461,332, filed on Aug. 30, 2021, now Pat. No. 11,676,641.

(51) Int. Cl.
*G11C 5/06* (2006.01)
*G11C 5/02* (2006.01)
(Continued)

(52) U.S. Cl.
CPC ............... *G11C 5/06* (2013.01); *G11C 5/025* (2013.01); *H01L 23/481* (2013.01); *H10B 12/00* (2023.02);
(Continued)

(58) Field of Classification Search
CPC ......... G11C 5/06; G11C 5/025; H01L 23/481; H01L 21/76898; H10B 12/00;
(Continued)

(56) References Cited

U.S. PATENT DOCUMENTS 11,063,024 B1    7/2021  Or-Bach et al.
11,217,565 B2 *  1/2022  Or-Bach ............... H01L 21/743
(Continued)

OTHER PUBLICATIONS

Non-Final Office Action on U.S. Appl. No. 17/461,332 DTD Oct. 6, 2022.
(Continued)

*Primary Examiner* — Fernando Hidalgo
(74) *Attorney, Agent, or Firm* — FOLEY & LARDNER LLP

(57) ABSTRACT

A memory device includes a first layer, wherein the first layer includes a first memory array, a first row decoder circuit, and a first column sensing circuit. The memory device includes a second layer disposed with respect to the first layer in a vertical direction. The second layer includes a first peripheral circuit operatively coupled to the first memory array, the first row decoder circuit, and the first column sensing circuit. The memory device includes a plurality of interconnect structures extending along the vertical direction. At least a first one of the plurality of interconnect structures operatively couples the second layer to the first layer.

20 Claims, 24 Drawing Sheets

(51) Int. Cl.
*H01L 23/48* (2006.01)
*H10B 12/00* (2023.01)
*H10B 61/00* (2023.01)
*H10B 63/00* (2023.01)
*H10N 50/01* (2023.01)
*H10N 50/80* (2023.01)
*H10N 70/00* (2023.01)

(52) U.S. Cl.
CPC ............. *H10B 61/00* (2023.02); *H10B 63/84* (2023.02); *H10N 50/01* (2023.02); *H10N 50/80* (2023.02); *H10N 70/011* (2023.02); *H10N 70/821* (2023.02)

(58) Field of Classification Search
CPC ........ H10B 61/00; H10B 63/84; H10B 63/80; H10B 80/00; H10B 12/50; H10N 50/01; H10N 50/80; H10N 70/011; H10N 70/821
USPC .................................................... 365/185.05
See application file for complete search history.

(56) References Cited

U.S. PATENT DOCUMENTS

| | | | |
|---|---|---|---|
| 11,676,641 B2 * | 6/2023 | Lee | H10B 12/00 |
| | | | 365/185.05 |
| 2021/0343571 A1 | 11/2021 | Or-Bach et al. | |
| 2022/0139946 A1 * | 5/2022 | Takaki | H01L 23/535 |
| | | | 257/314 |
| 2022/0199685 A1 | 6/2022 | Wan et al. | |
| 2022/0246216 A1 | 8/2022 | Lee et al. | |
| 2022/0271091 A1 | 8/2022 | Kim et al. | |
| 2022/0278122 A1 | 9/2022 | Lee | |
| 2022/0384467 A1 | 12/2022 | Kim et al. | |
| 2022/0415900 A1 * | 12/2022 | Lu | H01L 25/0657 |

OTHER PUBLICATIONS

Notice of Allowance on U.S. Appl. No. 17/461,332 DTD Feb. 7, 2023.

* cited by examiner

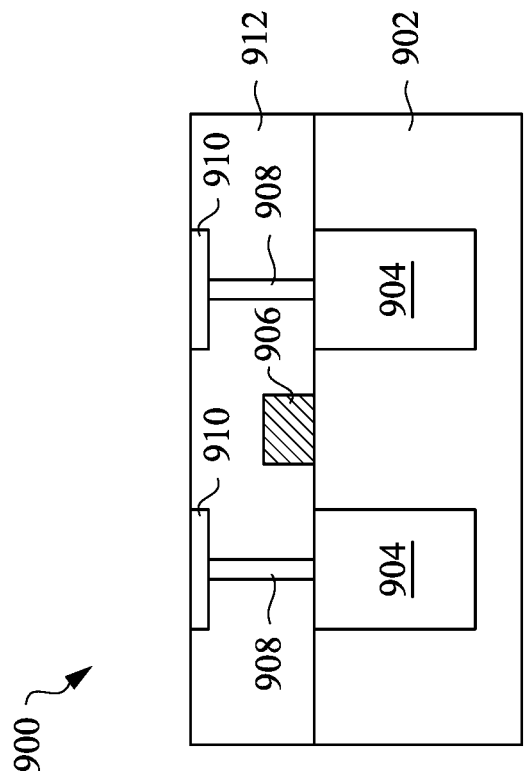
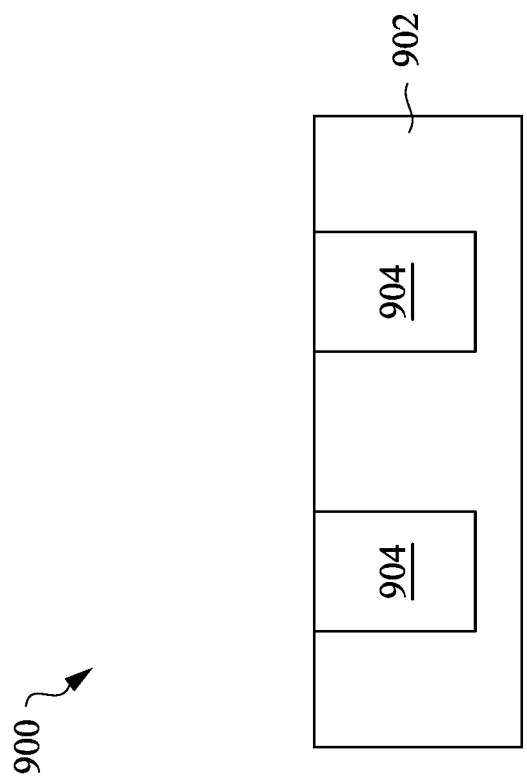
FIG. 9B
FIG. 9A

MEMORY SYSTEMS WITH VERTICAL INTEGRATION

REFERENCE TO RELATED APPLICATION

This application is a Continuation of U.S. patent application Ser. No. 17/461,332, filed Aug. 30, 2021, the entire disclosure of which is incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 9B, 9C, 9D, and 9E illustrates various cross-sectional views of a memory device formed based on the method of FIG. 8, in accordance with some embodiments.

DETAILED DESCRIPTION

Figure 1:
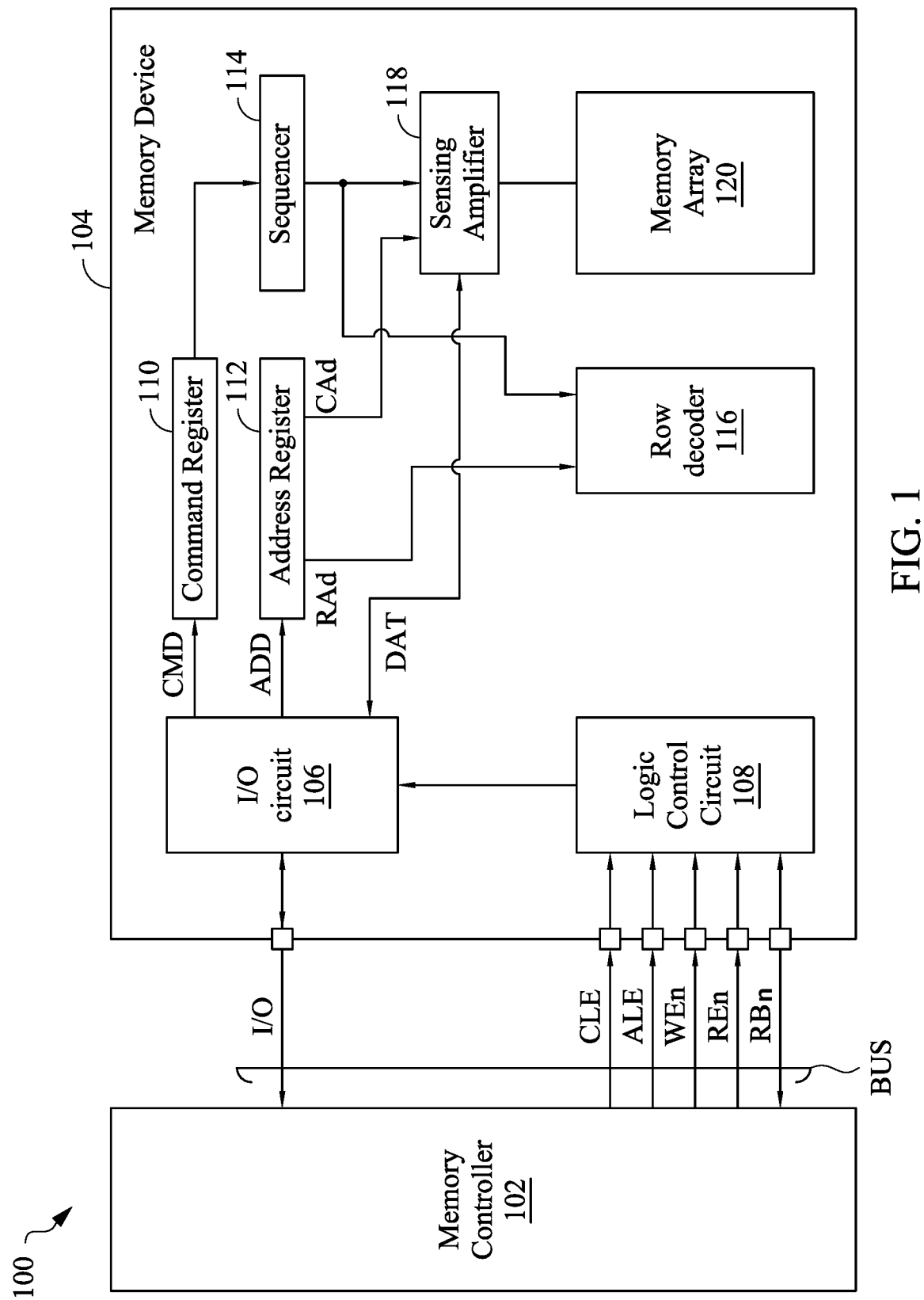
FIG. 1 illustrates a block diagram of an example memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a memory system includes a number of memory arrays, and a number of circuits operatively coupled to the memory arrays. Each of the memory arrays can be operated through one or more of the circuits. Conventionally, those memory arrays and the circuits are formed over a single substrate (e.g., wafer), which can encounter various issues as the technology node continues to shrink in dimensions. For example, some of the circuits that operate a memory array may be more speed and power sensitive, which may require those circuits to be fabricated with a more advanced technology node (e.g., smaller in dimensions). However, the memory array itself may require a higher voltage to be successfully programmed or read. Under such a scenario, a trade-off between performance of the operating circuits and yield of the memory array is commonly made, which can disadvantageously drag evolution of the memory system.

In another example, a central circuit typically controls a certain number of memory arrays. Such a central circuit is operatively coupled to those memory arrays via one or more respective conductor structures. With the number of memory arrays integrated onto one wafer becoming larger, a length of those conductor structures can be significantly extended, which may cause various issues such as, for example, increased IR drop, increased RC delay, etc. All of these issues can significantly deteriorate the performance and power consumption of a memory system. Thus, integration of the existing memory system has not been entirely satisfactory in many aspects.

The present disclosure provides various embodiments of systems and methods to form (e.g., integrate) a memory system that includes a number of memory arrays (or sub-arrays) and a number of circuits. As disclosed herein, the memory arrays, together with a number of essential circuits, may be formed on a first substrate or chip (e.g., a wafer); and the remaining circuits may be formed on a second substrate or chip (e.g., a wafer). In various embodiments, these two substrates/chips are vertically disposed from each other (and are thus referred to as a first layer and second layer, respectively), but operatively coupled to each other through a number of interconnect structures. Based on such an integration principle, different layers can be fabricated with respective technology nodes (i.e., free from the above-discussed trade-off issues), which can advantageously improve performance of the disclosed memory system as a whole. Further, following the principle, one or more additional layers can be integrated into the memory system, and in each of these additional layers, a respective type of memory array that may be different from other layer can be formed. As such, the memory system can be built with multiple applications. Still further, by coupling different layers of circuits or memory arrays with the vertical interconnect structures, a length of the interconnect structures can be significantly shorten, which can solve the issues encountered by the laterally integrated memory system. Accordingly, performance and power consumption of the disclosed memory system can be greatly improved.

FIG. 1 illustrates a block diagram of an example memory system 100, in accordance with various embodiments. The memory system 100 is a storage device configured to be connected to an external host device (not illustrated). It should be appreciated that the memory system 100, as shown in FIG. 1, is a simplified example, and thus, the memory system 100 can include any of various other components while remaining within the scope of the present disclosure. In general, the memory system 100 includes a memory controller 102 and a memory device 104 operatively coupled to each other.

The memory controller 102 is configured with, for example, an integrated circuit such as a system-on-a-chip (SoC) that may include one or more processing circuits, e.g., a Central Processing Unit (CPU), a Graphics Processing Unit (GPU), an Internet-of-Things (IoT) device etc. The memory controller 102 can control the memory device 104 based on a request from the host device. For example, the memory controller 102 writes data requested to be written by the host device, into the memory device 104. Further, the memory controller 102 reads data requested to be read from the host device from the memory device 104, and transmits the data to the host device.

The memory device 104 is a memory that stores data in a non-volatile or volatile manner. The memory device 104 includes a number of circuits and a number of memory arrays, as will be discussed below. Each of the memory arrays, together with a number of corresponding essential circuits, are formed over a first chip, and the rest of circuits are formed over a second chip that is vertically separated from but operatively coupled to the first chip, in accordance with various embodiments.

The memory controller 102 and the memory device 104 are operatively coupled to each other through BUS, which may transmit and/or receive data based on an interface such as, for example, a single data rate (SDR) interface, a toggle double data rate (DDR) interface, an open NAND flash interface (ONFI), among others. As shown, various (e.g., control) signals may be transmitted through the BUS. For example, a command latch enable (CLE) signal, an address latch enable (ALE) signal, a write enable (WEn) signal, a read enable (REn) signal, a ready busy (RBn) signal, and an input and output (I/O) signal. It should be understood that the BUS can transmit/receive any of various other signals while remaining with the scope of the present disclosure.

In brief overview, the CLE and ALE signals are configured to notify the memory device 104 that the I/O signal to the memory device 104 are respectively a command and an address. The WEn signal is configured to incorporate the I/O signal into the memory device 104. The REn signal is configured to read the I/O signal from the memory device 104. The RBn signal is configured to indicate whether the memory device 104 is in a ready state or a busy state. The ready state is a state in which the memory device 104 can receive an instruction from the memory controller 102. The busy state is a state in which the memory device 104 cannot receive the instruction from the memory controller 102. The I/O signal includes, for example, 8 bits. The I/O signal is data communicated between the memory device 104 and the memory controller 102. The I/O signal includes a command (CMD), an address information (ADD), and data (DAT), in some embodiments.

Referring next to the memory device 104 of the example in FIG. 1, the memory device 104 includes an I/O circuit 106, a logic control circuit 108, a command register (circuit) 110, an address register (circuit) 112, a sequencer (circuit) 114, a row decoder (circuit) 116, and a sensing amplifier (circuit) 118, and a memory array 120. Although one memory array is shown, it should be understood that the memory system 100 can include any number of memory arrays while remaining within the scope of the present disclosure. In at least one aspect of the present disclosure, each memory array 120 may be fabricated with its row decoder 116 and sensing amplifier 118 (which are sometimes referred to as essential circuits of the memory array 120) in one of a number of layers (e.g., substrates), while the remaining circuits 106 to 114 (which are sometimes referred to as peripheral circuits of the memory array 120) and the memory controller 102 may be fabricated in one or more of other layers.

The memory array 120 may include a plural number of memory cells, each of the memory cells is configured to store data. For example, the memory array may include a dynamic random-access memory (DRAM) array, a static random-access memory (SRAM) array, a resistive random-access memory (RRAM) array, a magnetoresistive random access memory (MRAM) array, a phase change random access memory (PCRAM) array, etc. Each array has its memory cells arranged in a column-row configuration, allowing each of which to be accessed through one of a number bit lines (e.g., disposed along one of the columns) and one of a number of word lines (e.g., disposed along one of the rows).

The I/O circuit 106 is configured to communicate the I/O signal with the memory controller 102. For example, when the I/O signal is received from the memory controller 102, the I/O circuit 106 can distribute the I/O signal to the CMD, ADD, and DAT based on information received from the logic control circuit 108. The I/O circuit 106 provides the CMD to the command register 110 and the ADD to the address register 112, respectively. Further, the I/O circuit 106 communicates the DAT with the sensing amplifier 118. The logic control circuit 108 is configured to receive the CLE, ALE, WEn, and Ren signals from the memory controller 102. The logic control circuit 108 can send out the above-mentioned information to the I/O circuit 106 for identifying the CMD, the ADD, and the DAT in the I/O signal. In addition, the logic control circuit 108 provides the RBn signal to the memory controller 102 to notify a state of the memory device 104.

The command register 110 is configured to store the CMD received from the I/O circuit 106. The CMD includes, for example, an instruction for causing the sequencer 114 to execute a read operation, a write operation, an erasing operation, or the like. The address register 14 is configured to store the address information ADD received from the I/O circuit 106. The ADD at least includes, for example, a row address (RAd) and a column address (CAd). The row address RAd and the column address CAd may be used to select a word line and a bit line, respectively. The sequencer 114 is configured to control an operation of the entire memory device 104. For example, the sequencer 114 can control the row decoder 116, the sensing amplifier 118, or the like based on the CMD stored in the command register 110, and execute a read operation, a write operation, an erasing operation, or the like.

The row decoder 116, which may include or be integrated with a driver (circuit), is configured to generate a voltage used in the read operation, the write operation, the erasing operation, or the like. The row decoder 116 can apply the generated voltage to a corresponding access line (e.g., a word line) based on, for example, the RAd stored in the address register 112. For example, one of the word lines may be selected by the row decoder 116 through three decoding stages: predecode, decode, and postdecode. The predecode stage determines which of a potentially hierarchical set of memory blocks contains the data, and recode address bits to reduce the fanout to the word line decoders of a single block. One or more word line decoders will respond to an address. The postdecode stage can then select a single word line. In some embodiments, the row decoder 116 can be implemented by a collection of $2^M$ logic gates (e.g., NAND gates, NOR gates, etc.) organized in a regular, dense fashion.

The sensing amplifier 118 may include or be integrated with a column decoder. Accordingly, the sensing amplifier 118 may sometimes be referred to as a column sensing circuit. The sensing amplifier 118 is configured to receive a small signal from a selected memory cell and amplify it to a large signal, thereby differentiating a logic state of the data stored in the selected memory cell which may be provided as the DAT. The sensing amplifier 118 can read out the data from the selected cell that is an the intersection of a word line and bit line based on, for example, the CAd stored in the address register 112. For example, during such a read operation, an entire row of data may be temporarily read out of the memory array based on the selected word line (as discussed above). The desired piece of the row of data (e.g., one of the bit lines) is then multiplexed onto the DAT through a column decoder included in or integrated with the sensing amplifier 118.

Figure 2:
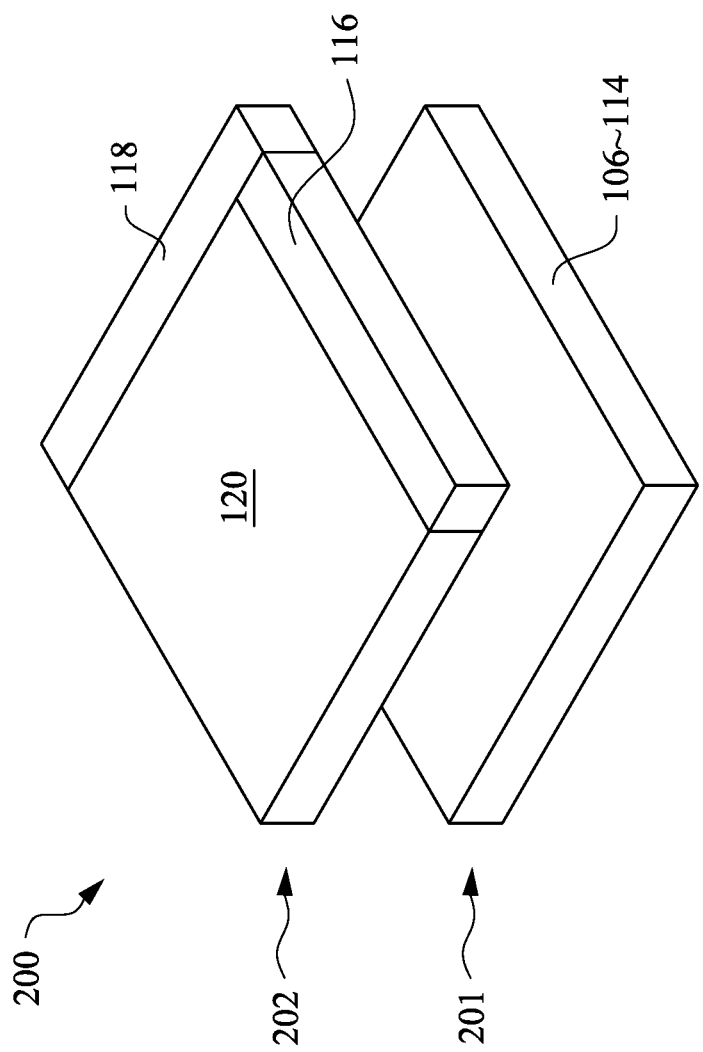
FIG. 2 illustrates a perspective view of a portion of a memory system that includes one or more components of FIG. 1, in accordance with some embodiments.

FIG. 2 illustrates a perspective view of an example portion of a memory system 200, which at least includes a first layer 201 and a second layer 202, in accordance with various embodiments. The memory system 200 may include substantially similar components as the memory system 100 of FIG. 1. It should be understood that the configuration of memory system 200 shown in FIG. 2 is simplified for illustration purposes, and thus, the memory system 200 can include any of various other layers while remaining within the scope of the present disclosure.

In some embodiments, the first and second layers, 201 and 202, are vertically arranged with respect to each other. Although such two layers, 201 and 202, are shown as being separated from each other in the example of FIG. 2, it should be appreciated that these two layers may be (e.g., operatively and/or physically) coupled to each other through one or more interconnect structures (e.g., through-silicon-vias (TSVs)), which will be discussed below with reference to FIGS. 7A-11E. Further, in some embodiments, the first layer 201 may include a first substrate (or chip) where a number of peripheral circuits of the memory system 200 are formed (hereinafter "peripheral layer 201"); and the second layer 202 may include a second substrate (or chip) where at least one memory array of the memory system 200 and a number of its essential circuits are formed (hereinafter "memory array layer 202").

Using FIG. 1 as a non-limiting example, the peripheral layer 201 may include the I/O circuit 106, logic control circuit 108, command register 110, address register 112, and sequencer 114; and the memory array layer 202 may include the row decoder 116, the sensing amplifier 118, and the memory array 120. The row decoder 116 and the sensing amplifier 118 can abut a first side and a second side of the memory array 120, respectively. Further, devices (e.g., transistors) of the circuits on the peripheral layer 201 may be fabricated with a smaller technology node, while devices (e.g., transistors) of the circuits and memory cells on the memory array layer 202 may be separately fabricated with a larger technology node. In this way, while keeping high performance (e.g., high speed, low operation voltages, low delay) of certain control circuits of the memory system 200, memory cells of the memory system 200 can still be properly programmed, read, and/or erased.

Figure 3:
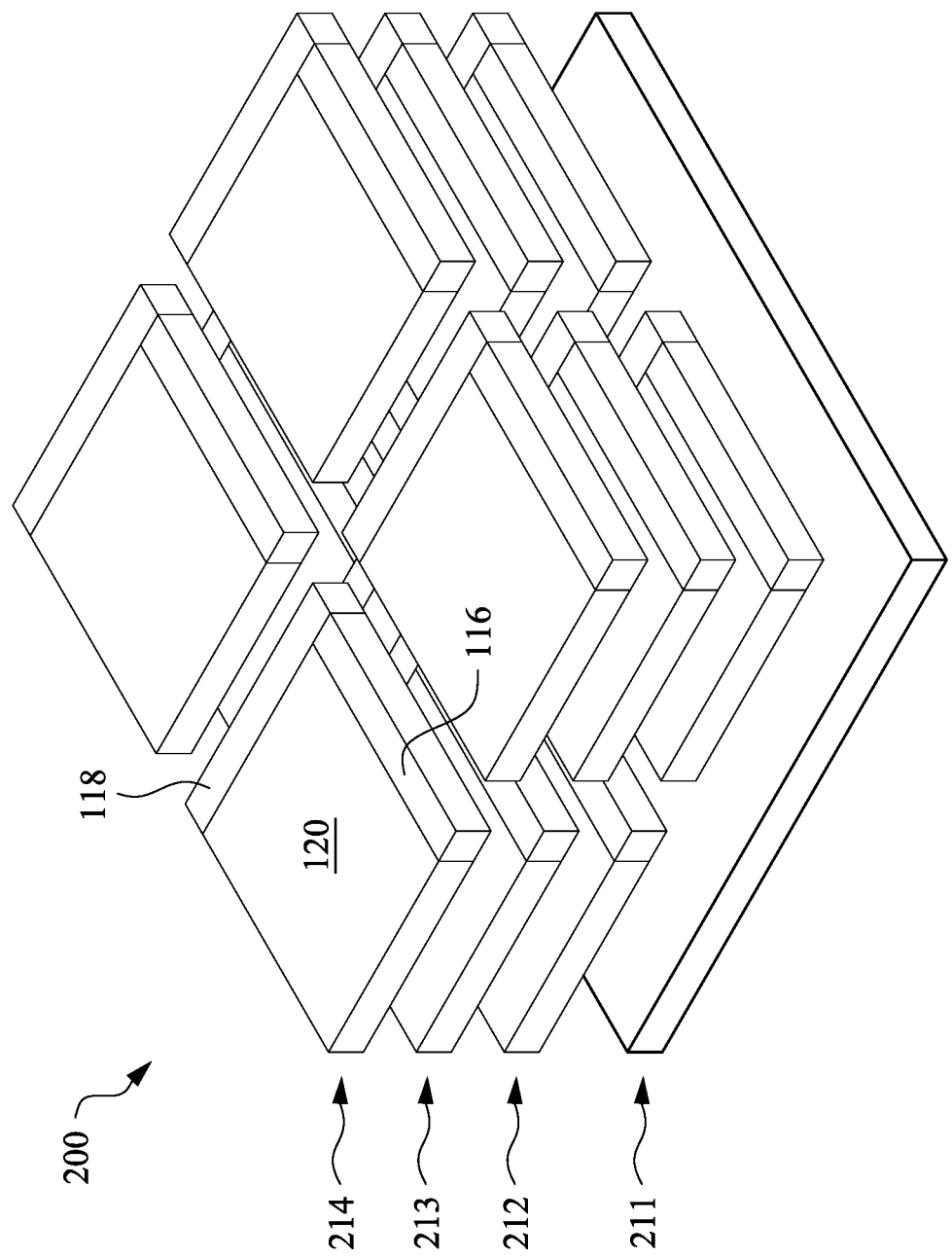
FIG. 3 illustrates a perspective view of a portion of a memory system that includes one or more components of FIG. 1, in accordance with some embodiments.

FIG. 3 illustrates a perspective view of another example portion of the memory system 200, which includes a first layer 211, a second layer 212, a third layer 213, and a fourth layer 214, in accordance with various embodiments. The first through fourth layers, 211 to 214, are vertically arranged with respect to each other. Although such four layers are shown as being separated from each other in the example of FIG. 3, it should be appreciated that these layers may be (e.g., operatively and/or physically) coupled to each other through one or more interconnect structures (e.g., through-silicon-vias (TSVs)).

In some embodiments, the first layer 211 includes a first substrate where a number of peripheral circuits of the memory system 200 are formed (hereinafter "peripheral layer 211"); the second layer 202 includes a second substrate where at least four memory arrays and their corresponding essential circuits of the memory system 200 are formed (hereinafter "memory array layer 212"); the third layer 213 includes a third substrate where at least four memory arrays and their corresponding essential circuits of the memory system 200 are formed (hereinafter "memory array layer 213"); and the fourth layer 214 includes a fourth substrate where at least four memory arrays and their corresponding essential circuits of the memory system 200 are formed (hereinafter "memory array layer 214").

Similar as the example of FIG. 2, the peripheral layer 211 can include a number of control circuits (e.g., 106 to 114) to respectively control the memory arrays 120 (and their essential circuits, 116 and 118) in the memory array layers 212 to 214. In FIG. 3, each of the memory arrays 120 is abutted to its essential circuits 116 and 118, and neighboring memory arrays (together with their respective essential circuits) in a single memory array layer may be laterally separated from one another. The laterally disposed memory arrays (and their essential circuits) can be operatively coupled to one another through an interposer formed below, for example, the memory arrays. The interposer generally include an interposer substrate and a plurality of redistribution layers (RDLs) formed through at least a portion of the interposer substrate. Further, such a spacing between the neighboring memory arrays (together with their respective essential circuits) may be filled with a dielectric material, as shown in FIG. 4A.

Figure 4A:
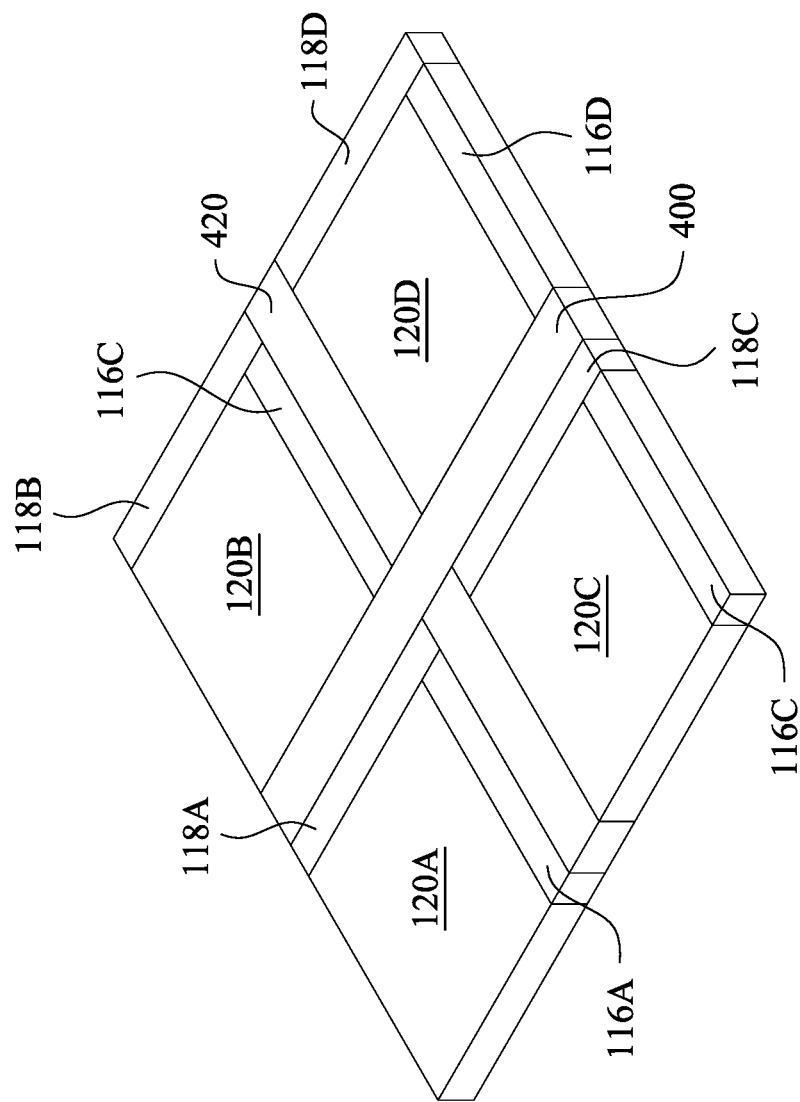
FIGS. 4A, 4B, 4C, and 4D each illustrate a perspective view of a memory array layer of a memory system that includes one or more components of FIG. 1, in accordance with some embodiments.

Specifically in FIG. 4A, memory array 120A is abutted to its row decoder 116A and sensing amplifier 118A; memory array 120B is abutted to its row decoder 116B and sensing amplifier 118B; memory array 120C is abutted to its row decoder 116C and sensing amplifier 118C; and memory array 120D is abutted to its row decoder 116D and sensing amplifier 118D. Between the neighboring memory arrays (120A and 120B) and (120C and 120D), a dielectric spacer 400 is disposed; and between the neighboring memory arrays (120A and 120C) and (120B and 120D), a dielectric spacer 420 is disposed. Stated another way, a first dielectric spacer (e.g., 400) can be disposed between two neighboring memory arrays, with one side of the dielectric spacer abutted to one or more sensing amplifiers (e.g., 118A, 118C) and the other opposite side of the dielectric spacer abutted to one or more memory arrays (e.g., 120B, 120D); and a second dielectric spacer (e.g., 420) can be disposed between two neighboring memory arrays, with one side of the dielectric spacer abutted to one or more row decoders (e.g., 116A, 116B) and the other opposite side of the dielectric spacer abutted to one or more memory arrays (e.g., 120C, 120D). Other configurations of the memory arrays, essential circuits, and dielectric spacers (if any) in one memory array layer can also be implemented, while remaining within the scope of the present disclosure.

In some embodiments, such a dielectric spacer can provide real estate to allow one or more interconnect structures (e.g., TSVs) to pass therethrough. As will be discussed in detail below with reference to FIGS. 7A-11E, such TSVs can operatively (e.g., electrically) couple one or more transistors in a peripheral layer to the memory arrays and their essential circuits in one of a number of memory array layer. However, each of these TSVs can be selectively coupled to one or more subsets of the memory array layers, in accordance with various embodiments. As such, some of the TSVs may pass through, but not electrically couple to, one or more of the memory array layers.

Figure 4B:
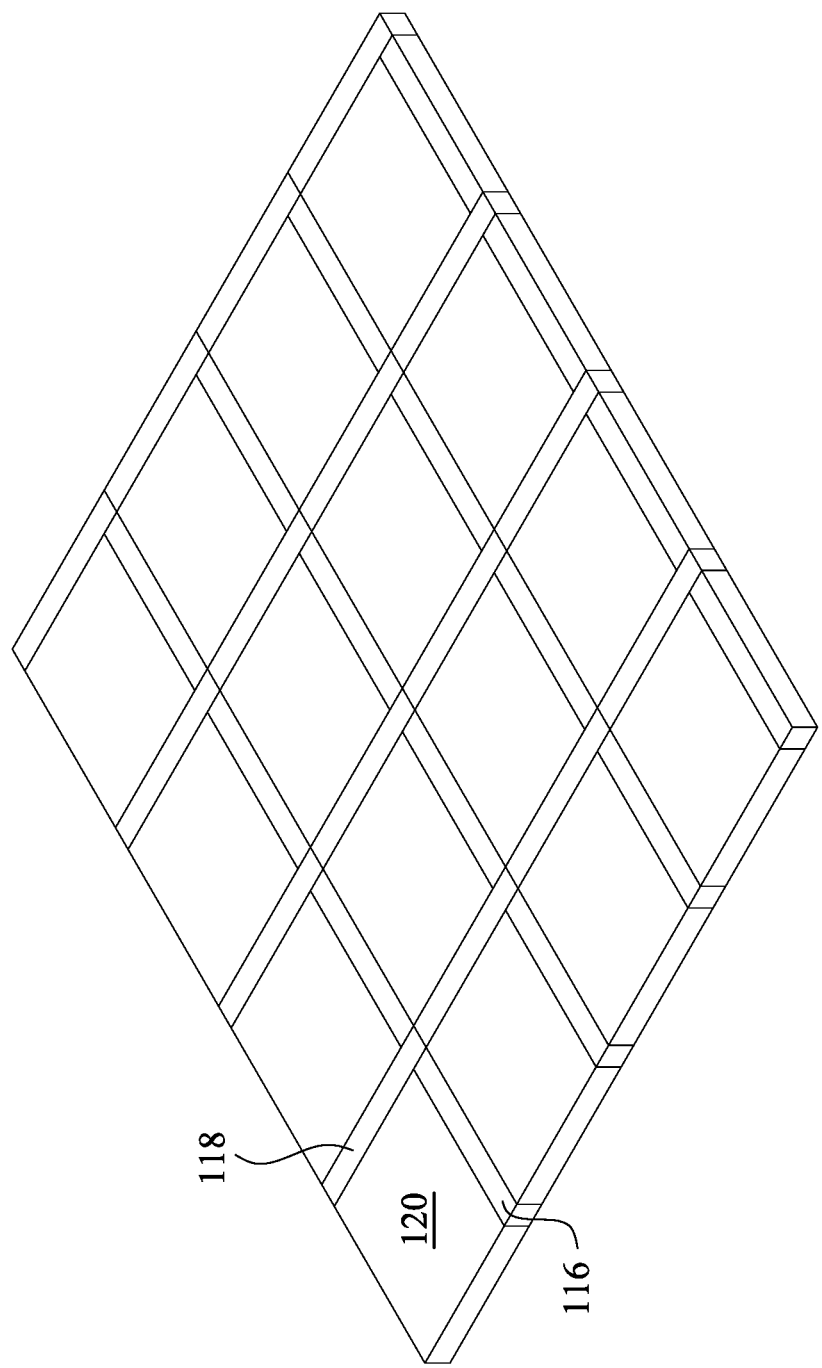
Figure 4C:
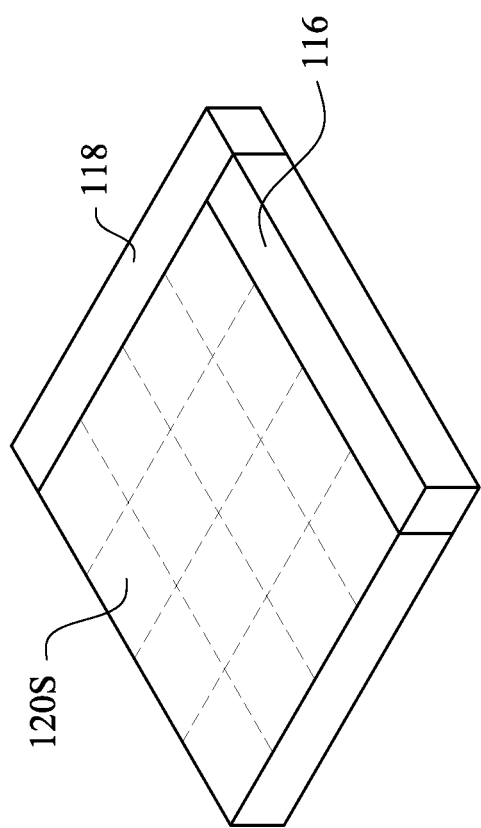
Figure 4D:
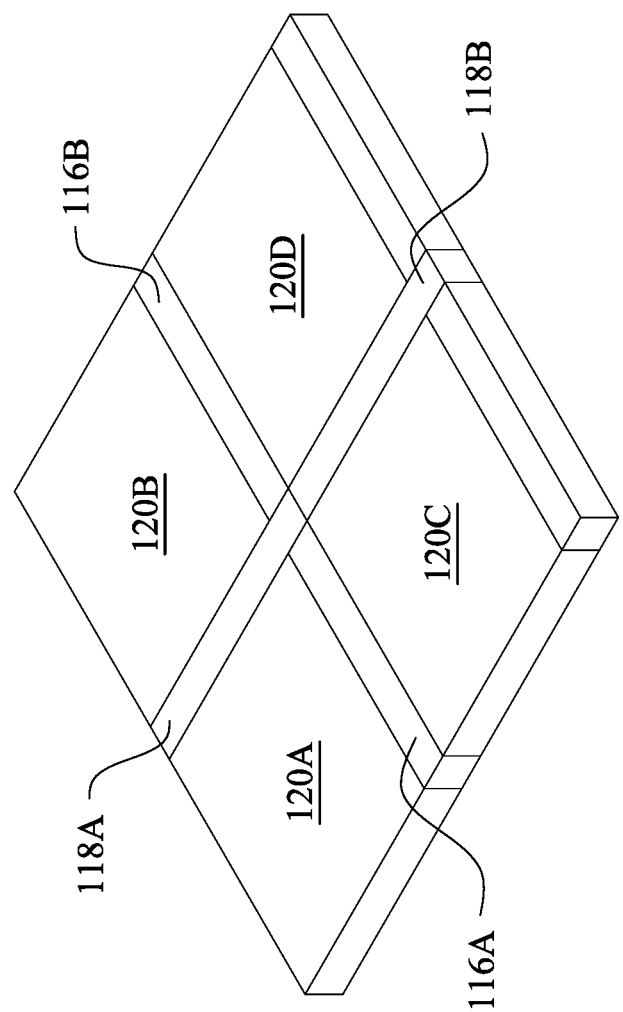

FIGS. 4B, 4C, and 4D illustrate various other configurations between the memory arrays 120 and their essential circuits 116 and 118 in one memory array layer, in accordance with some embodiments. Referring first to FIG. 4B, a number of memory arrays, together with their essential circuits, abut to each other without a dielectric spacer disposed therebetween. Specifically, one memory array, with its corresponding essential circuits, directly abut neighboring memory arrays, with their corresponding essential circuits. Referring next to FIG. 4C, a number of memory arrays are abutted to one another, without a dielectric spacer or essential circuit disposed therebetween. Specifically, such memory arrays may share global essential circuits. Referring then to FIG. 4D, a number of memory arrays abut to each other, without a dielectric spacer but with a shared essential circuit disposed therebetween. Specifically, memory array 120A abuts memory array 120B, without a dielectric spacer but with a shared essential circuit (sensing amplifier) 118A disposed therebetween; memory array 120C abuts memory array 120D, without a dielectric spacer but with a shared essential circuit (sensing amplifier) 118B disposed therebetween; memory array 120A abuts memory array 120C, without a dielectric spacer but with a shared essential circuit (row decoder) 116A disposed therebetween; and memory array 120B abuts memory array 120D, without a dielectric spacer but with a shared essential circuit (row decoder) 116B disposed therebetween.

Figure 5A:
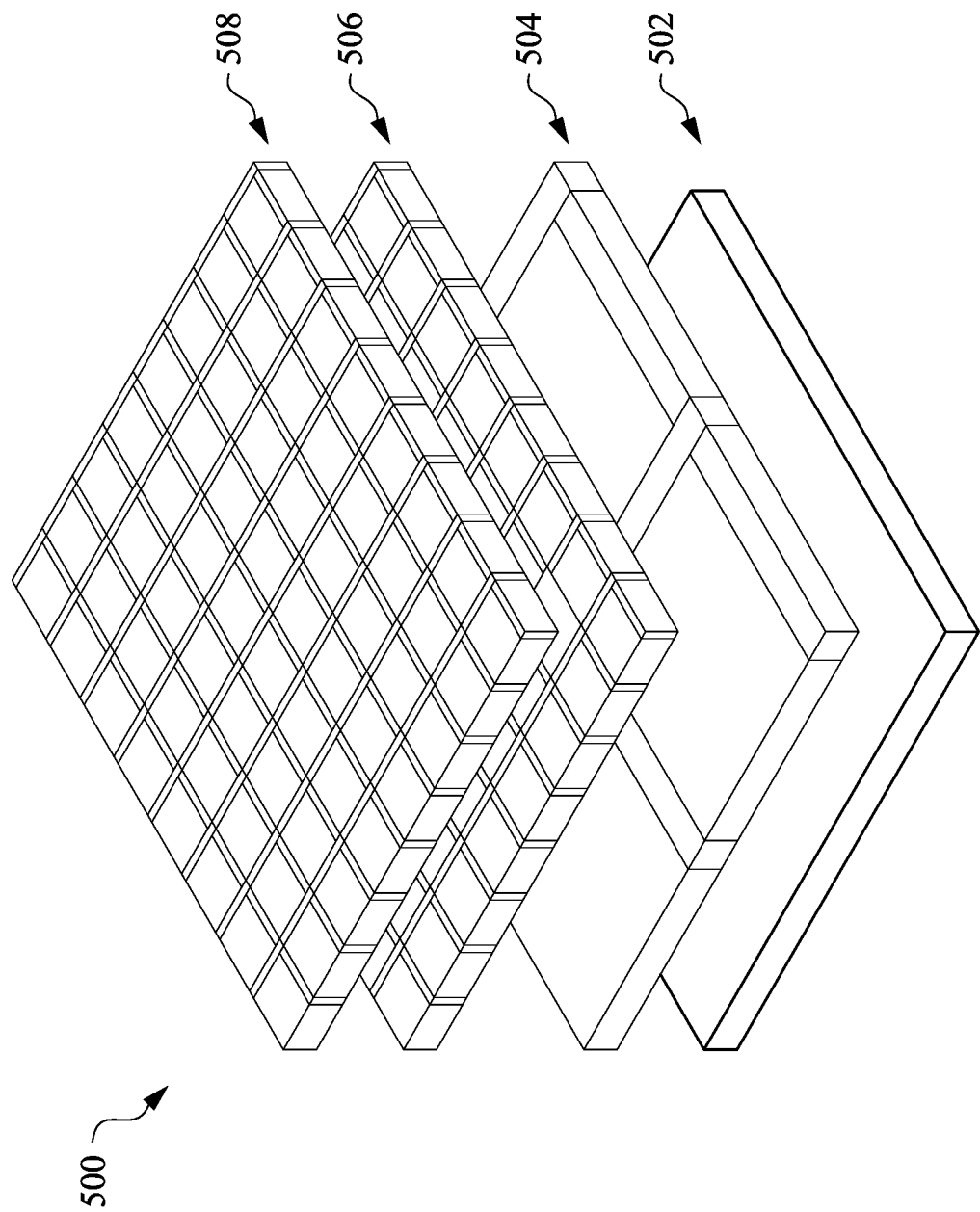
FIGS. 5A, 5B, and 5C each illustrate a perspective view of a memory system that includes one or more components of FIG. 1, in accordance with some embodiments.
Figure 5B:
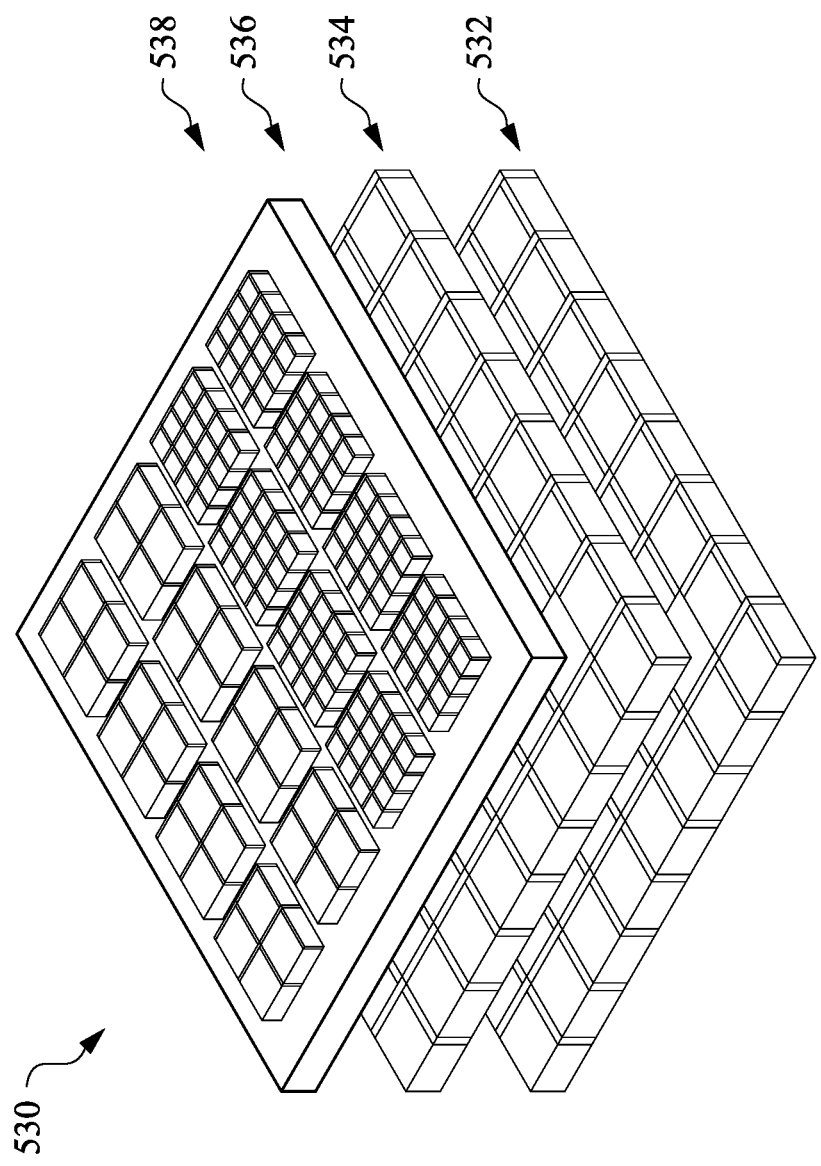
Figure 5C:
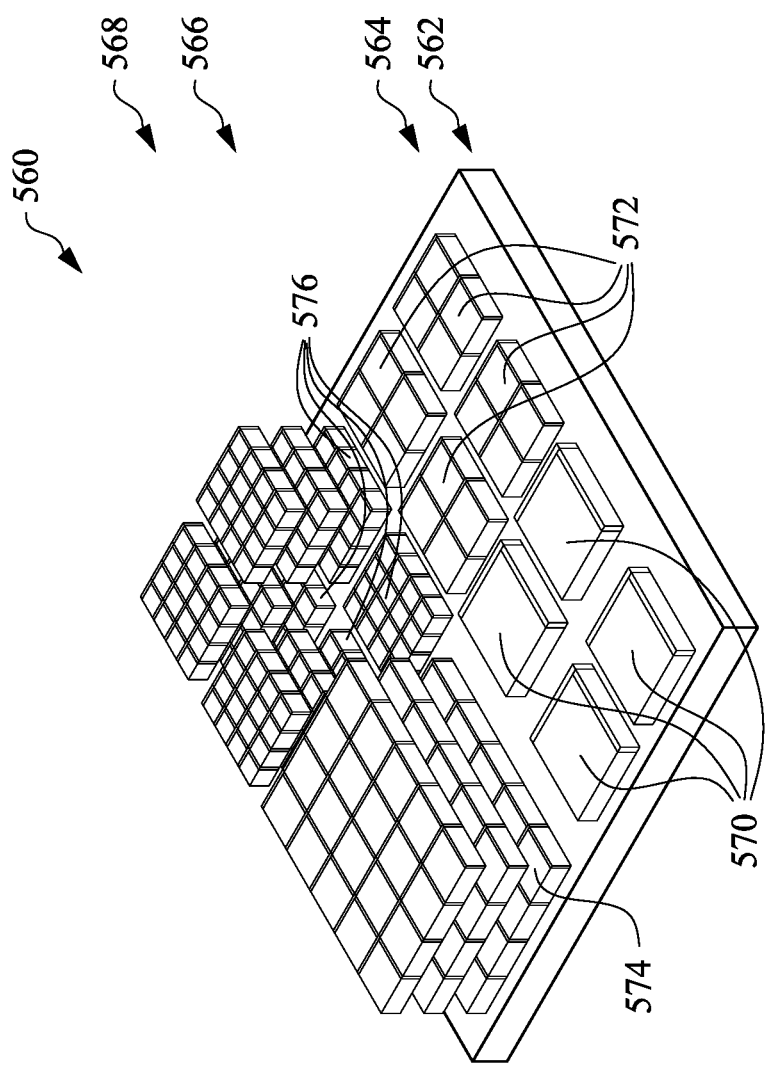

FIGS. 5A, 5B, and 5C illustrate perspective views of various other example memory systems 500, 530, and 560, respectively, in accordance with various embodiments. The memory systems 500 to 560 may each include substantially similar components as the memory system discussed above, e.g., 100 of FIG. 1. It should be understood that the configurations of memory systems 500 to 560 shown in FIGS. 5A-C are simplified for illustration purposes, and thus, the memory systems 500 to 560 can each include any of various other layers while remaining within the scope of the present disclosure.

In FIG. 5A, the memory system 500 includes a peripheral layer 502, a first memory array layer 504, a second memory array layer 506, a third memory array layer 508. Each of the memory array layers 504 to 508 is operatively coupled to the peripheral layer 502, according to various embodiments. It should be appreciated that the memory system 500 can include any number of memory array layers between any of the memory array layers, or between the peripheral layer and one of the memory array layers, while remaining within the scope of the present disclosure. The peripheral layer 502 may be vertically disposed below a bottommost one of the memory array layers (e.g., 504). Each of the memory array layers 506 to 508 includes a number of memory arrays (120) each of which is abutted to its respective essential circuits (116 and 118), as configured in the example of FIG. 4B. The memory array layer 504 includes a number of memory arrays (120), some of which are abutted to each other and share global essential circuits (116 and 118), as configured in the example of FIG. 4C. As such, different memory array layers may have a similar or different number (or size) of memory arrays, as shown in FIG. 5A.

In FIG. 5B, the memory system 530 includes a first memory array layer 532, a second memory array layer 534, a peripheral layer 536, and a third memory array layer 538. Each of the memory array layers 532-534 and 538 is operatively coupled to the peripheral layer 536, according to various embodiments. It should be appreciated that the memory system 530 can include any number of memory array layers between any of the memory array layers, or between the peripheral layer and one of the memory array layers, while remaining within the scope of the present disclosure. The peripheral layer 536 may be vertically disposed between the memory array layers 534 and 538. Each of the memory array layers 532 and 534 includes a number of memory arrays (120) each of which is abutted to its respective essential circuits (116 and 118), as configured in the example of FIG. 4B. The memory array layer 538 includes a number of first sub-chips 540 (as similarly configured in FIG. 4B) laterally separated apart from each other, and a number of second sub-chips 542 (as similarly configured in FIG. 4C) laterally separated apart from each other. Alternatively stated, in any of the memory array layers (e.g., 538), a first number of memory arrays can abut each other (e.g., each of the sub-chips 540) and a second number of memory arrays can abut each other (e.g., each of the sub-chips 542), wherein the first number can be similar to or different from the second number.

In FIG. 5C, the memory system 560 includes a peripheral layer 562, a first memory array layer 564, a second memory array layer 566, and a third memory array layer 568. Each of the memory array layers 564 to 568 is operatively coupled to the peripheral layer 562, according to various embodiments. It should be appreciated that the memory system 560 can include any number of memory array layers between any of the memory array layers, or between the peripheral layer and one of the memory array layers, while remaining within the scope of the present disclosure. The peripheral layer 562 may be vertically disposed below a bottommost one of the memory array layers (e.g., 564). Similar as the layers 538 of FIG. 5B, each of the memory array layers 564 to 568 can include a "mixed" arrangement of sub-chips. For example, the memory array layer 564 includes a number of first sub-chips 570, a number of second sub-chips 572, a number of third sub-chips 574, and a number of fourth sub-chips 576. Each of the sub-chips can be configured in a different number of memory arrays (e.g., different sizes).

Figure 6A:
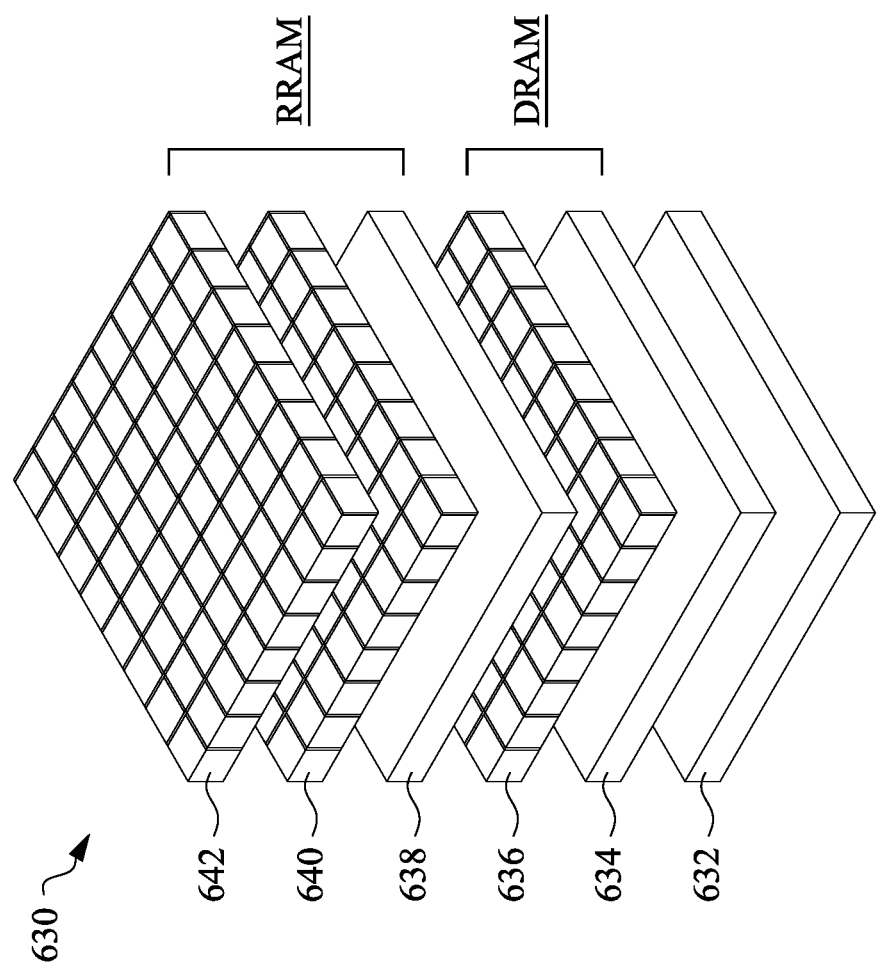
FIGS. 6A, 6B, and 6C each illustrate a perspective view of a memory system that includes one or more components of FIG. 1, in accordance with some embodiments.
Figure 6B:
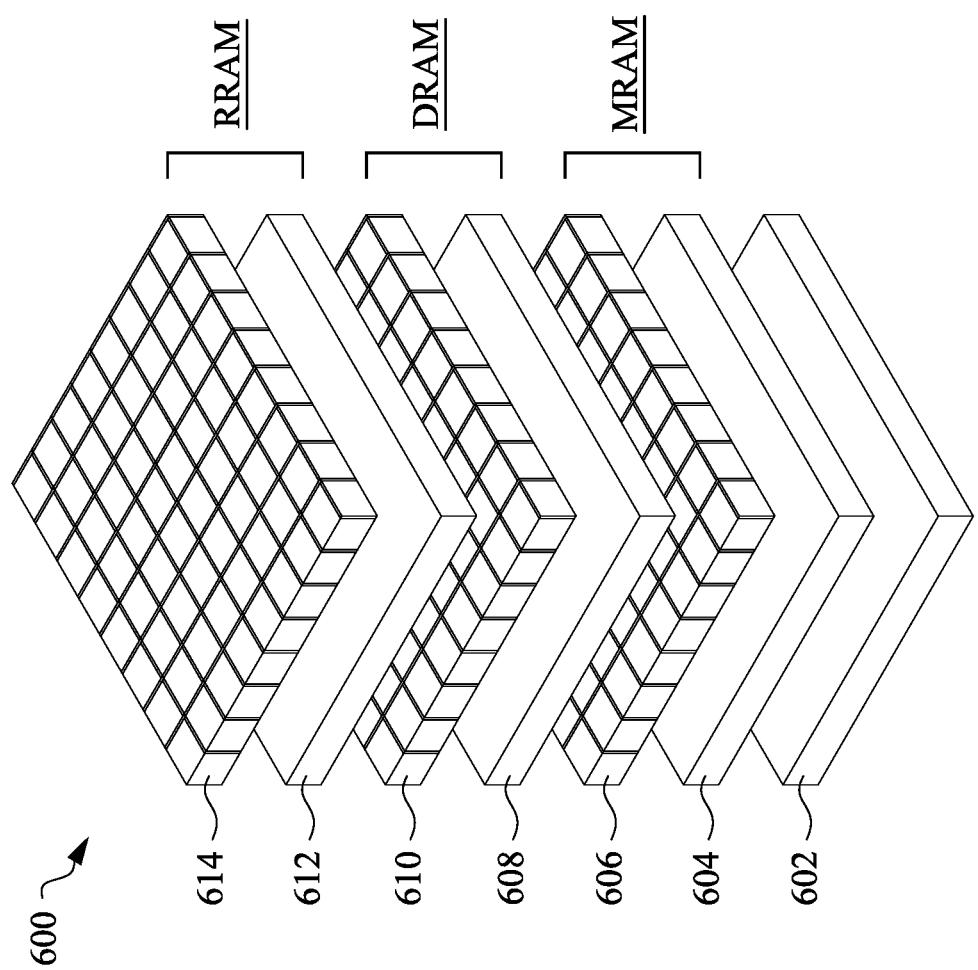
Figure 6C:
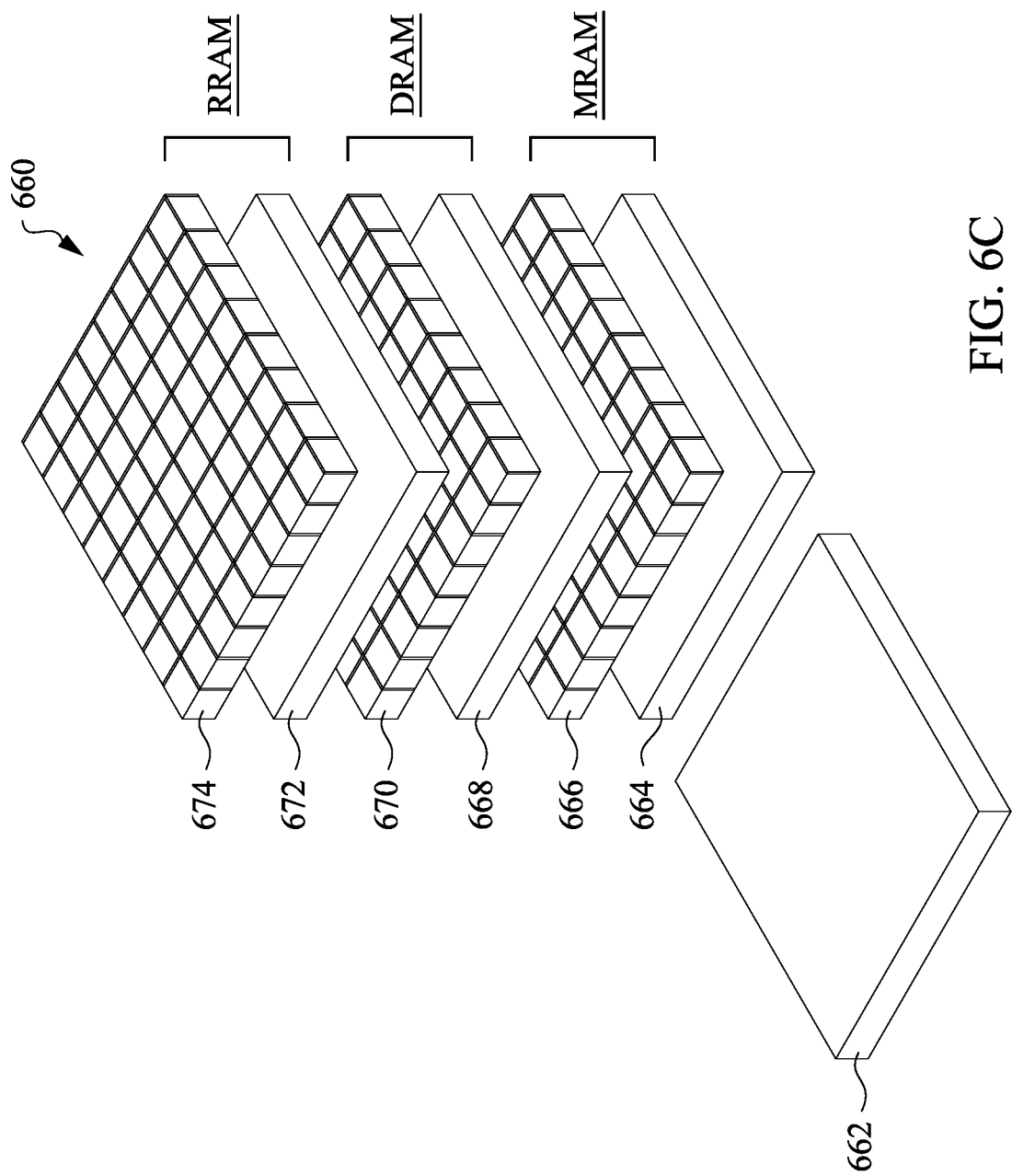

FIGS. 6A, 6B, and 6C illustrate perspective views of various other example memory systems 600, 630, and 660, respectively, in accordance with various embodiments. The memory systems 600 to 660 may each include substantially similar components as the memory system discussed above, e.g., 100 of FIG. 1. In some embodiments, the memory systems 600 to 660 each include different types of memory arrays integrated with one another. It should be understood that the configurations of memory systems 600 to 660 shown in FIGS. 6A-C are simplified for illustration purposes, and thus, the memory systems 600 to 660 can each include any of various other layers while remaining within the scope of the present disclosure.

In FIG. 6A, the memory system 600 includes a controller layer 602, a first peripheral layer 604, a first memory array layer 606, a second peripheral layer 608, a second memory array layer 610, a third peripheral layer 612, and a third memory array layer 614. The first memory array layer 606 may include a number of a first type of memory arrays (e.g., MRAM arrays), the second memory array 610 may include a number of a second type of memory arrays (e.g., DRAM arrays), and the third memory array layer 614 may include a number of a third type of memory arrays (e.g., RRAM arrays). According to various embodiments, each of the memory array layers 606, 610, and 614 is operatively coupled to and disposed immediately below or above a corresponding one of the peripheral layers 604, 608, and 612. For example, the peripheral layer 604, operatively coupled to the MRAM array layer 606, is disposed directly therebelow.

Further, the controller layer 602 can include a memory controller (e.g., 102 of FIG. 1). In one aspect of the present disclosure, the controller layer 602 can be operatively coupled to each of the memory array layers 606, 610, and 614 and each of the peripheral layers 604, 608, and 612. In another aspect of the present disclosure, the controller layer 602 can be operatively coupled to each of the memory array layers 606, 610, and 614 or each of the peripheral layers 604, 608, and 612. The controller layer 602 may be vertically disposed below a bottommost one of the memory array layers or the peripheral layers (e.g., 604).

In FIG. 6B, the memory system 630 includes a controller layer 632, a first peripheral layer 634, a first memory array layer 636, a second peripheral layer 638, a second memory array layer 640, and a third memory array layer 642. The first memory array layer 636 may include a number of a first type of memory arrays (e.g., DRAM arrays), and the second and third memory arrays 640 and 642 may each include a number of a second type of memory arrays (e.g., RRAM arrays). According to various embodiments, each of the memory array layers 636, 640, and 642 is operatively coupled to and disposed immediately below or above a corresponding one of the peripheral layers 634 and 638. For example, the peripheral layer 638, operatively coupled to the DRAM array layers 640 and 642, is disposed directly thereunder.

Further, the controller layer 632 can include a memory controller (e.g., 102 of FIG. 1). In one aspect of the present disclosure, the controller layer 632 can be operatively coupled to each of the memory array layers 636, 640, and 642 and each of the peripheral layers 634 and 638. In another aspect of the present disclosure, the controller layer 632 can be operatively coupled to each of the memory array layers 636, 640, and 642 or each of the peripheral layers 634 and 638. The controller layer 632 may be vertically disposed below a bottommost one of the memory array layers or the peripheral layers (e.g., 634).

In FIG. 6C, the memory system 660 includes a controller layer 662, a first peripheral layer 664, a first memory array layer 666, a second peripheral layer 668, a second memory array layer 670, a third peripheral layer 672, and a third memory array layer 674. The first memory array layer 666 may include a number of a first type of memory arrays (e.g., MRAM arrays), the second memory array 670 may include a number of a second type of memory arrays (e.g., DRAM arrays), and the third memory array layer 674 may include a number of a third type of memory arrays (e.g., RRAM arrays). According to various embodiments, each of the memory array layers 666, 670, and 674 is operatively coupled to and disposed immediately below or above a corresponding one of the peripheral layers 664, 668, and 672. For example, the peripheral layer 664, operatively coupled to the MRAM array layer 666, is disposed directly thereunder.

Further, the controller layer 662 can include a memory controller (e.g., 102 of FIG. 1). In one aspect of the present disclosure, the controller layer 662 can be operatively coupled to each of the memory array layers 666, 670, and 674 and each of the peripheral layers 664, 668, and 672. In another aspect of the present disclosure, the controller layer 662 can be operatively coupled to each of the memory array layers 666, 670, and 674 or each of the peripheral layers 664, 668, and 672. The controller layer 662 may be laterally disposed next to a bottommost one of the memory array layers or the peripheral layers (e.g., 664). That is, the controller layer 662 and the peripheral layer 664 may be formed over respective different portions of a same substrate/chip.

Although such different types (e.g., functions) of memory arrays are integrated in a vertically stacked manner, it should be understood that different types of memory arrays (or even circuits) can be laterally integrated while remaining within the scope of the present disclosure. The laterally disposed circuits can be operatively coupled to one another through an interposer formed below, for example, the circuits. The interposer generally includes an interposer substrate and a plurality of redistribution layers (RDLs) formed through at least a portion of the interposer substrate.

Figure 7A:
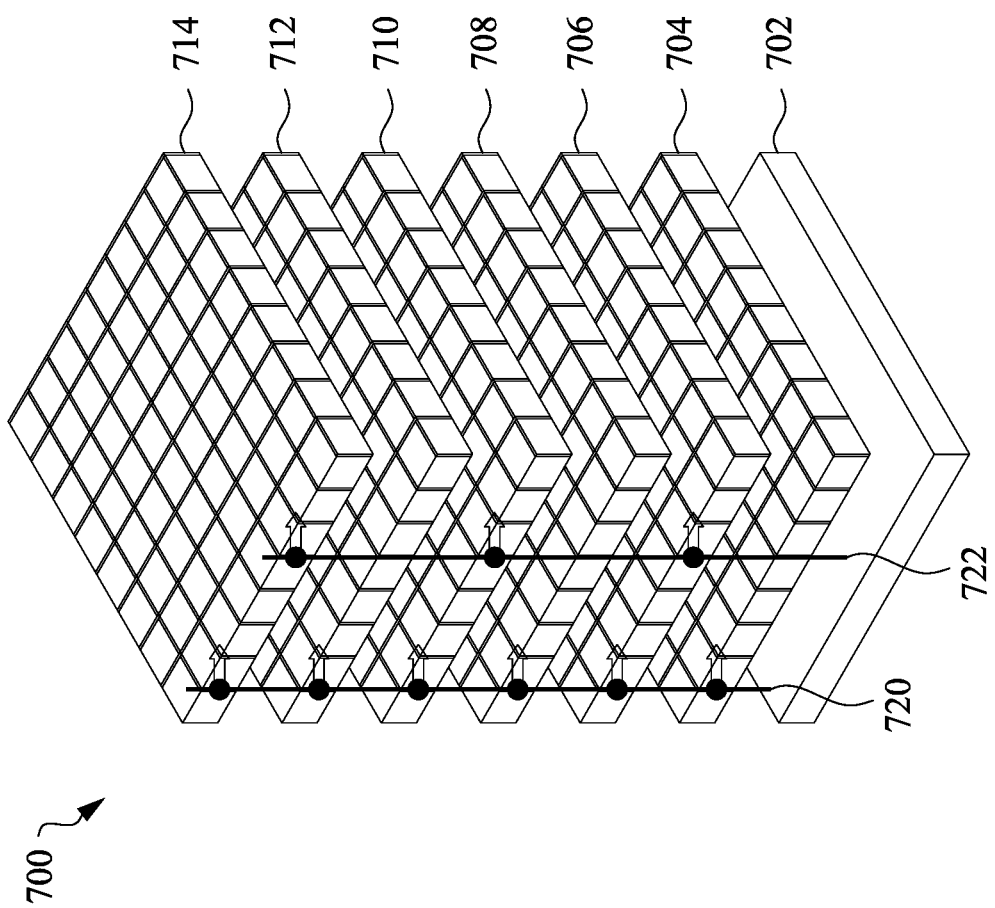
FIGS. 7A and 7B illustrate a number of interconnect structures to couple different layers of a memory system, in accordance with some embodiments.
Figure 7B:
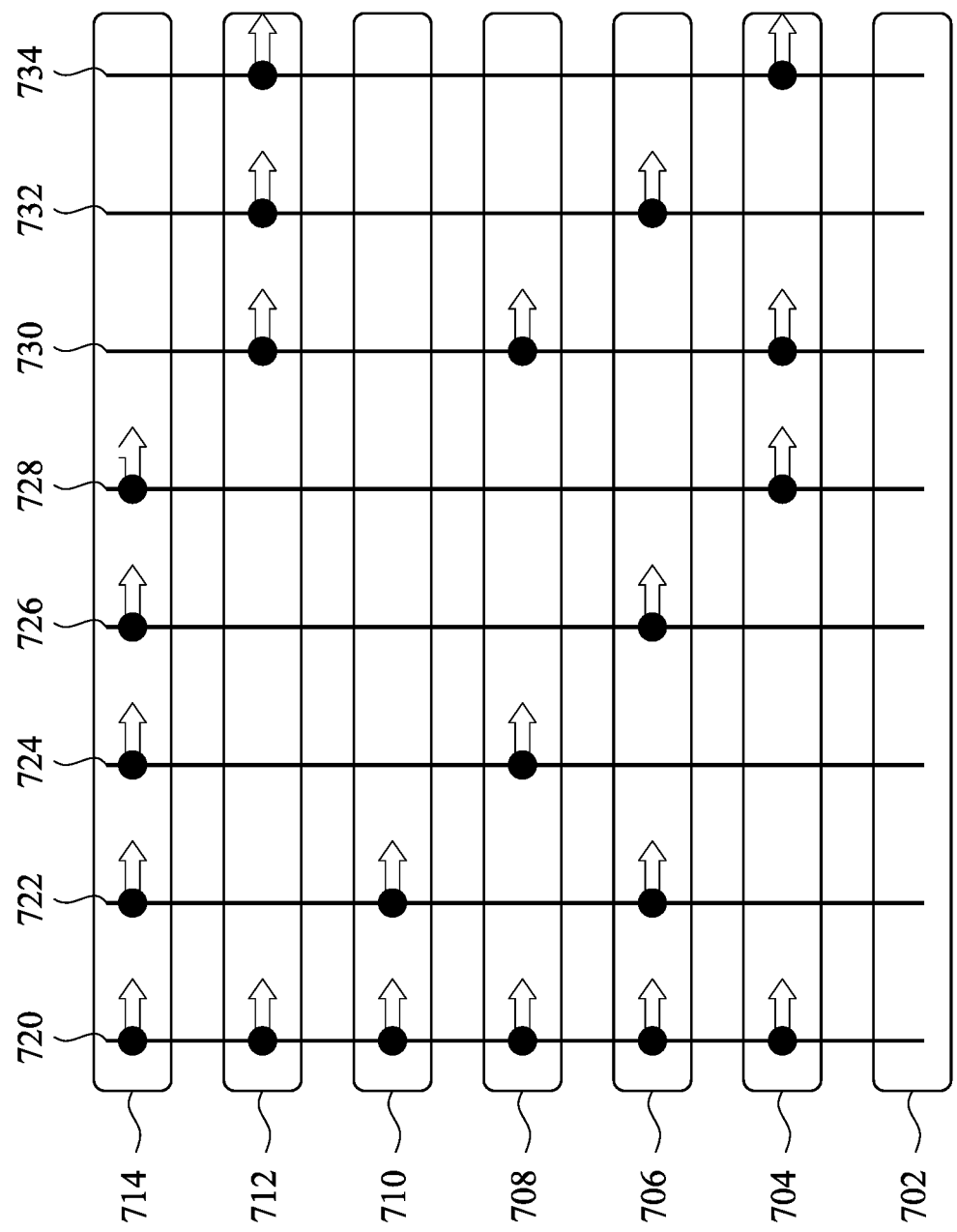

FIG. 7A illustrates a perspective view of an example memory system 700 including a number of interconnect structures, 720 and 722, configured to operatively couple one layer to one or more other layers that are vertically integrated (e.g., stacked) on top of one another, in accordance with various embodiments. The memory system 700 may include substantially similar components as the memory system discussed above, e.g., 100 of FIG. 1. It should be understood that the configuration of memory system 700 shown in FIG. 7A is simplified for illustration purposes, and thus, the memory system 700 can include any of various other layers and/or have different configurations (e.g., different layers coupled to each other, depending on desired designs, etc.), while remaining within the scope of the present disclosure.

As shown, the memory system 700 includes a peripheral layer 702, a number of memory array layers 704, 706, 708, 710, 712, and 714 disposed above the peripheral layer 702. According to various embodiments of the present disclosure, the peripheral layer 702 can be operatively coupled to one or more of the memory array layers 704 to 714 through one or more interconnect structures, e.g., TSVs. Alternatively stated, each of the TSVs may be selectively coupled to one or more of the memory array layers 704 to 714. With such a flexibility, (e.g., RC) loading of each of the TSVs can be optimally tuned, which can improve operation speed of the system 700 as a whole.

For example in FIG. 7A, the peripheral layer 702 is operatively coupled to each of the memory array layers 704 to 714 through TSV 720, while the peripheral layer 702 is operatively coupled to the memory array layers 706, 710, and 714 (but not to the memory array layers 704, 708, or 712) through TSV 722. As further shown in FIG. 7B, the memory system 700 further includes: TSV 724 operatively coupled to the memory array layers 708 and 714 (but not to any other memory array layers); TSV 726 operatively coupled to the memory array layers 706 and 714 (but not to any other memory array layers); TSV 728 operatively coupled to the memory array layers 704 and 714 (but not to any other memory array layers); TSV 730 operatively coupled to the memory array layers 704, 708, and 712 (but not to any other memory array layers); TSV 732 operatively coupled to the memory array layers 706 and 712 (but not to any other memory array layers); and TSV 734 operatively coupled to the memory array layers 704 and 712 (but not to any other memory array layers).

Figure 8:
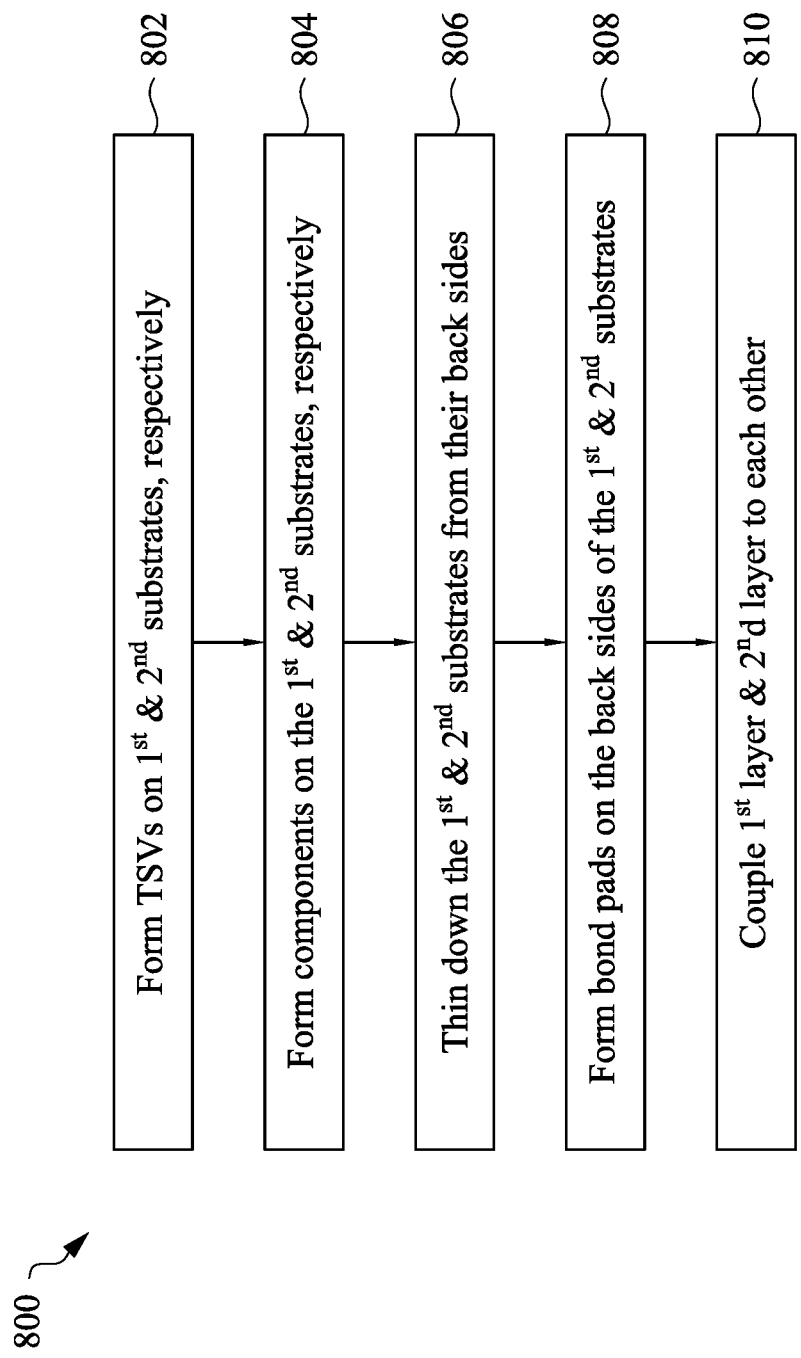
FIG. 8 illustrates a flow chart of an example method to form a number of interconnect structures to couple different layers of a memory system, in accordance with some embodiments.

FIG. 8 illustrates a flowchart of a method 800 to form a memory system including different layers operatively coupled to each other through TSVs, according to one or more embodiments of the present disclosure. For example, at least some of the operations (or steps) of the method 800 can be used to form a memory system discussed above. It is noted that the method 800 is merely an example, and is not intended to limit the present disclosure. Accordingly, it should be understood that additional operations may be provided before, during, and/or after the method 800 of FIG. 8, and that some other operations may only be briefly described herein. In some embodiments, operations of the method 800 may be associated with cross-sectional views of an example semiconductor device at various fabrication stages as shown in FIGS. 9A, 9B, 9C, 9D, and 9E, respectively, which will be discussed in further detail below.

Corresponding to operation 802 of FIG. 8, FIG. 9A illustrates a cross-sectional view of a portion of a semiconductor device 900 including a first substrate (or chip) 902 with a number of TSVs 904 formed over a front surface of the first substrate 902 at one of the various stages of fabrication, in accordance with various embodiments.

The first substrate 902 may be a semiconductor substrate, such as a bulk semiconductor, a semiconductor-on-insulator (SOI) substrate, or the like, which may be doped (e.g., with a p-type or an n-type dopant) or undoped. The first substrate 902 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 902 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The TSV 904 is formed of a conductive material. The conductive material may comprise copper, although other suitable materials such as aluminum, alloys, doped polysilicon, combinations thereof, and the like, may alternatively be utilized. At this fabrication stage, the TSV 904 may not completely extend through the first substrate 902, i.e., not extending from the front surface to back surface of the first substrate 902. The TSV 904 may be forming by performing at least some of the following processes: forming an opening through the front surface of the first substrate 902; lining the opening with a barrier layer (not shown); filling the opening with the above-mentioned conductive material; and polishing the first substrate 902. Although not shown, it should be noted that the same processes to form the TSV 904 (and the following operations of FIG. 8 except for operation 810) can be concurrently performed on a second substrate (chip) of the semiconductor device 900.

Corresponding to operation 804 of FIG. 8, FIG. 9B illustrates a cross-sectional view of a portion of the semiconductor device 900 including a number of components 906, 908, and 910 formed over the front surface of the substrate 902 at one of the various stages of fabrication, in accordance with various embodiments.

In the illustrated example of FIG. 9B (and the following figures), the component 906 can represent a number of devices such as, for example, transistors, memory cells, etc.; the component 908 can represent a number of via structures electrically coupled to the TSVs 904 (and the component 906), respectively; and the component 910 can represent a number of interconnect structures electrically coupled to the via structures 908, respectively. Such components 906 to 910 may be overlaid by a dielectric layer 912, typically referred to as an inter-layer dielectric (ILD) or inter-metal dielectric (IMD). Upon forming such components, one of the above-discussed memory array layer, peripheral layer, or controller layer may have been formed, in accordance with some embodiments. For example, for a memory array layer, the component 906 can represent: (i) a number of memory cells collectively functioning as one or more memory arrays (e.g., 120); and (ii) a number of transistors collectively functioning as one or more essential circuits (e.g., 116 and 118). And, the components 908 and 910 can represent: (i) a number of access lines (e.g., bit lines, word lines, source lines, etc.) of the memory arrays; and (ii) a number of interconnect structures coupled to the memory arrays.

Figure 9C:
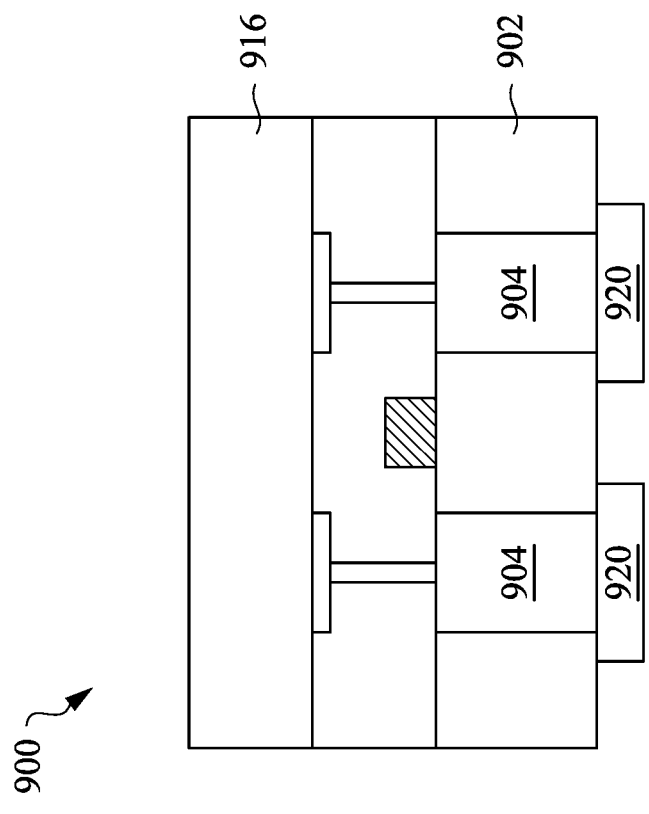

Corresponding to operation 806 of FIG. 8, FIG. 9C illustrates a cross-sectional view of a portion of the semiconductor device 900 in which the first substrate 902 is thinned down from its back surface at one of the various stages of fabrication, in accordance with various embodiments. As shown, the first substrate 902 is thinned down from its back surface until a bottom surface of the TSV 904 is exposed. In some embodiments, the first substrate 902 may be thinned down using a polishing process (e.g., a chemical-mechanical polishing (CMP) process), while having its front surface coupled to a carrier wafer 916.

Figure 9D:
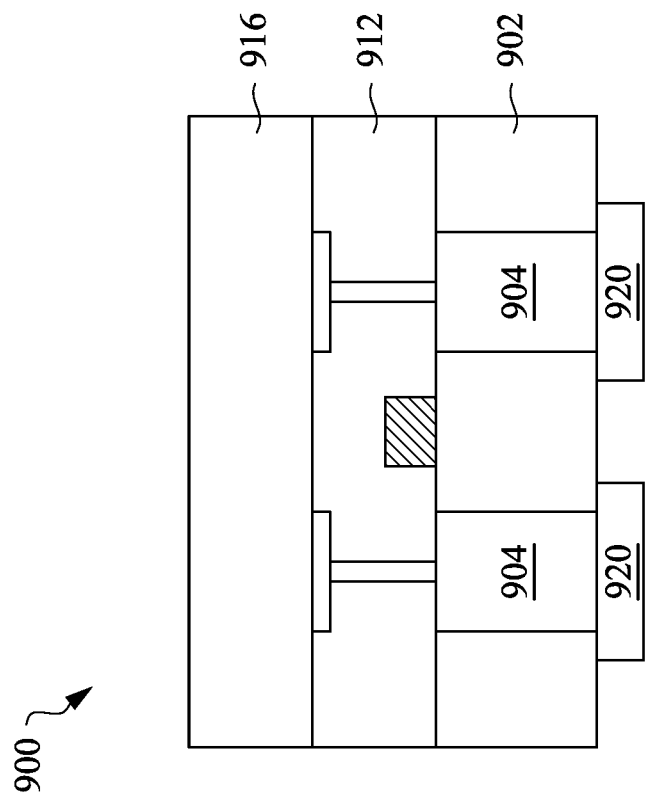

Corresponding to operation 808 of FIG. 8, FIG. 9D illustrates a cross-sectional view of a portion of the semiconductor device 900 including a number of bonding pads 920 coupled to the TSVs 904, respectively, at one of the various stages of fabrication, in accordance with various embodiments. Upon the bottom surface of the TSV 904 being exposed, the bonding pad 920 is formed to electrically couple to the TSV 904, thereby allowing the TSV 904 to be electrically coupled to other components, as will be discussed as follows. The bonding pad 920 is formed of a conductive material. The conductive material may comprise copper, although other suitable materials such as aluminum, alloys, doped polysilicon, combinations thereof, and the like, may alternatively be utilized.

Figure 9E:
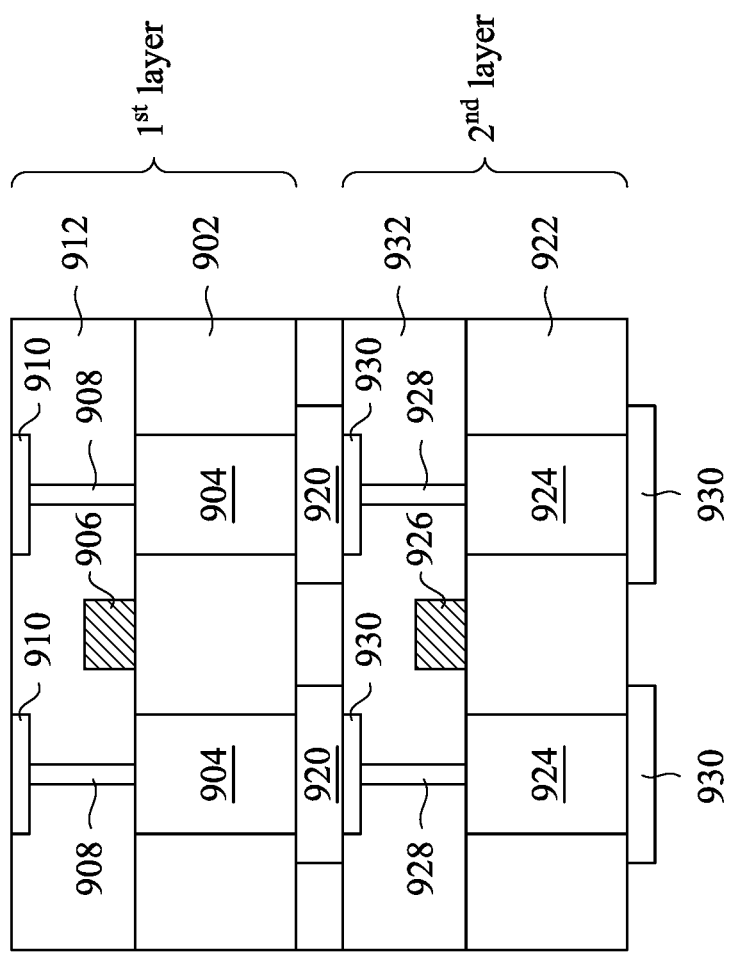

Corresponding to operation 810 of FIG. 8, FIG. 9E illustrates a cross-sectional view of a portion of the semiconductor device 900 including a first layer and a second layer bonded to each other at one of the various stages of fabrication, in accordance with various embodiments. As mentioned above, the operations 802 to 808 can be concurrently performed on a second substrate (chip), which results in a similar layer being formed. As shown in FIG. 9E, after forming the bonding pads 920, a first layer (which can be one of the above-described memory array layer, peripheral layer, or controller layer) is bonded to a second layer (which can be one of the above-described memory array layer, peripheral layer, or controller layer). Similar to the first layer, the second layer includes a thinned substrate 922, one or more TSVs 924 extending through the thinned substrate 922, components 926, 928, and 930, an ILD/IMD 932, and one or more bonding pads 930. In the illustrated example of FIG. 9E, the first layer is bonded (e.g., operatively coupled) to the second layer through the TSVs 904. It should be appreciated that each of the first and second layers can be coupled to one or more other layers through its respective TSVs to form one of the memory systems, as discussed above.

Figure 10:
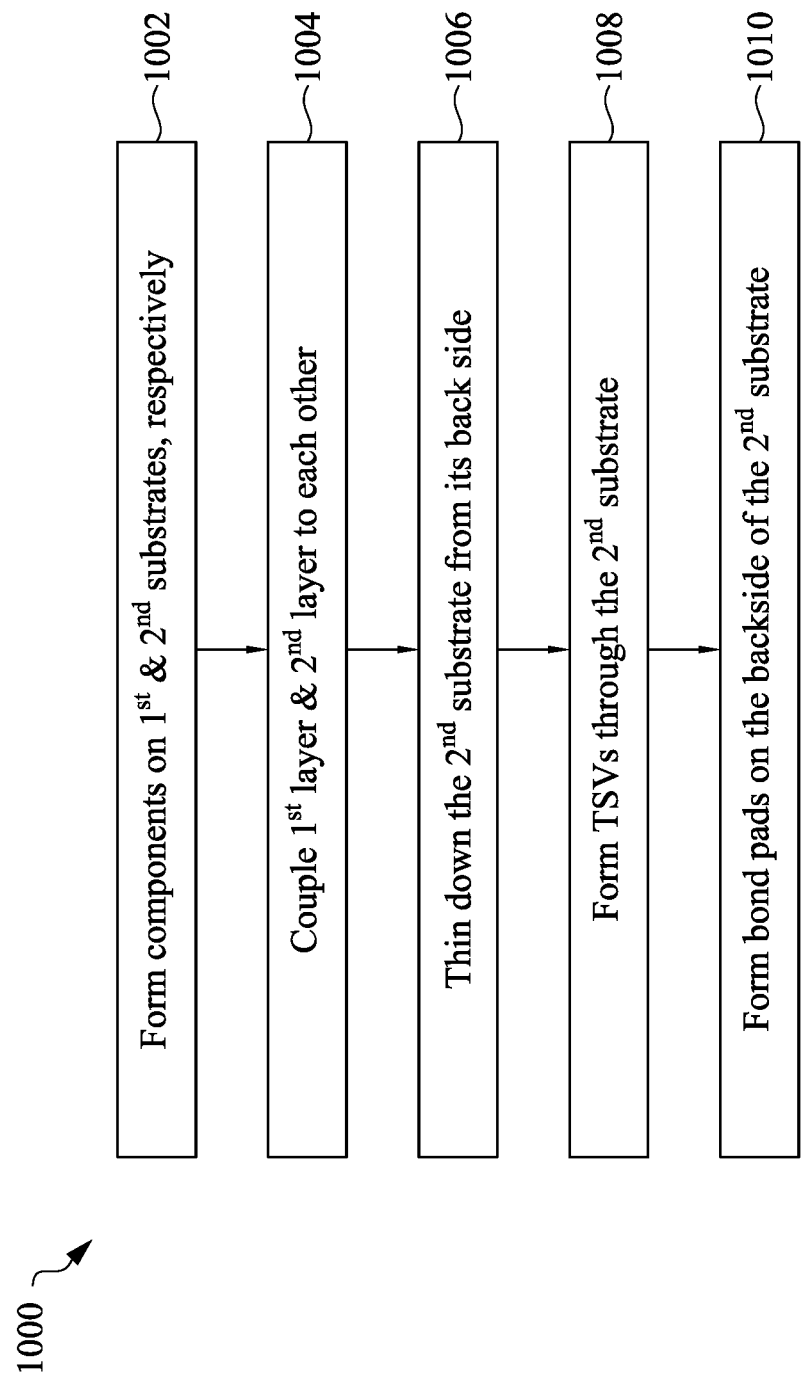
FIG. 10 illustrates a flow chart of an example method to form a number of interconnect structures to couple different layers of a memory system, in accordance with some embodiments.

FIG. 10 illustrates a flowchart of a method 1000 to form a memory system including different layers operatively coupled to each other through TSVs, according to one or more embodiments of the present disclosure. For example, at least some of the operations (or steps) of the method 1000 can be used to form a memory system discussed above. It is noted that the method 1000 is merely an example, and is not intended to limit the present disclosure. Accordingly, it should be understood that additional operations may be provided before, during, and/or after the method 1000 of FIG. 10, and that some other operations may only be briefly described herein. In some embodiments, operations of the method 1000 may be associated with cross-sectional views of an example semiconductor device at various fabrication stages as shown in FIGS. 11A, 11B, 11C, 11D, and 11E, respectively, which will be discussed in further detail below.

Figure 11B:
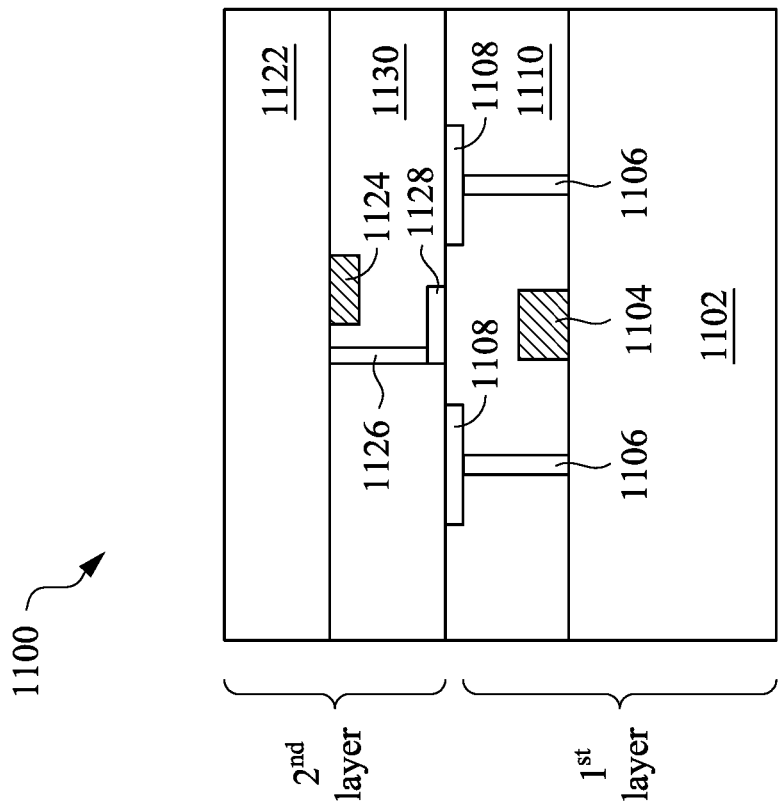
FIGS. 11A, 11B, 11C, 11D, and 11E illustrates various cross-sectional views of a memory device formed based on the method of FIG. 10, in accordance with some embodiments.
Figure 11A:
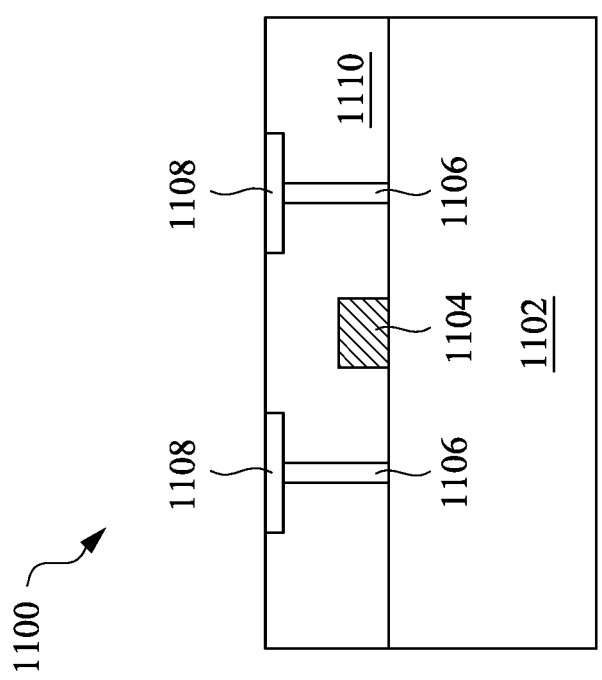

Corresponding to operation 1002 of FIG. 10, FIG. 11A illustrates a cross-sectional view of a portion of a semiconductor device 1100 including a first substrate (or chip) 1102 with a number of components 1104, 1106, and 1108 formed over a front surface of the first substrate 1102 at one of the various stages of fabrication, in accordance with various embodiments.

The first substrate 1102 may be a semiconductor substrate, such as a bulk semiconductor, a semiconductor-on-insulator (SOI) substrate, or the like, which may be doped (e.g., with a p-type or an n-type dopant) or undoped. The first substrate 1102 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 1102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In the illustrated example of FIG. 11A (and the following figures), the component 1104 can represent a number of devices such as, for example, transistors, memory cells, etc.; the component 1106 can represent a number of via structures electrically coupled to the component 1104; and the component 1108 can represent a number of interconnect structures electrically coupled to the via structures 1106, respectively. Such components 1104 to 1108 may be overlaid by a dielectric layer 1110, typically referred to as an inter-layer dielectric (ILD) or inter-metal dielectric (IMD). Upon forming such components, one of the above-discussed memory array layer, peripheral layer, or controller layer may have been formed, in accordance with some embodiments. For example, for a memory array layer, the component 1104 can represent: (i) a number of memory cells collectively functioning as one or more memory arrays (e.g., 120); and (ii) a number of transistors collectively functioning as one or more essential circuits (e.g., 116 and 118). And, the components 1106 and 1108 can represent: (i) a number of access lines (e.g., bit lines, word lines, source lines, etc.) of the memory arrays; and (ii) a number of interconnect structures coupled to the memory arrays. It should be noted that the same processes to form the components 1104 to 1108 can be concurrently performed on a second substrate (chip) of the semiconductor device 1100, which will be shown as follows.

Corresponding to operation 1004 of FIG. 10, FIG. 11B illustrates a cross-sectional view of a portion of a semiconductor device 1100 including a first layer and a second layer bonded to each other at one of the various stages of fabrication, in accordance with various embodiments. As shown in FIG. 11B, a first layer including the first substrate 1102 and components 1104 to 1108 (which can be one of the above-described memory array layer, peripheral layer, or controller layer) is bonded to a second layer (which can be one of the above-described memory array layer, peripheral layer, or controller layer). Similar to the first layer, the second layer includes a (second) substrate 1122, components 1124, 1126, and 1128, and an ILD/IMD 1130. In the illustrated example of FIG. 11B, the second layer is bonded to the first layer by being flipped upside down.

Figure 11D:
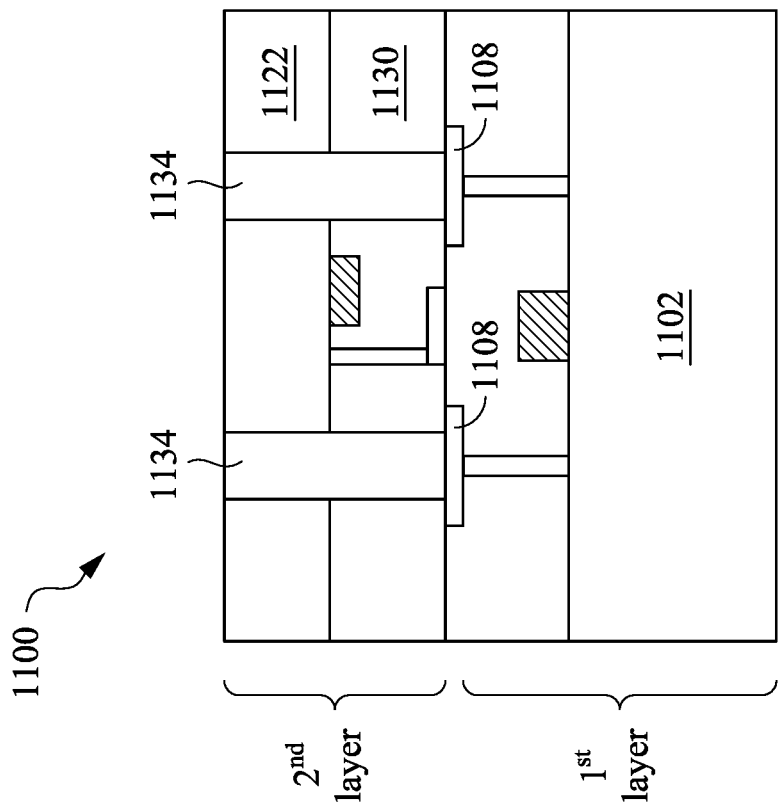
Figure 11C:
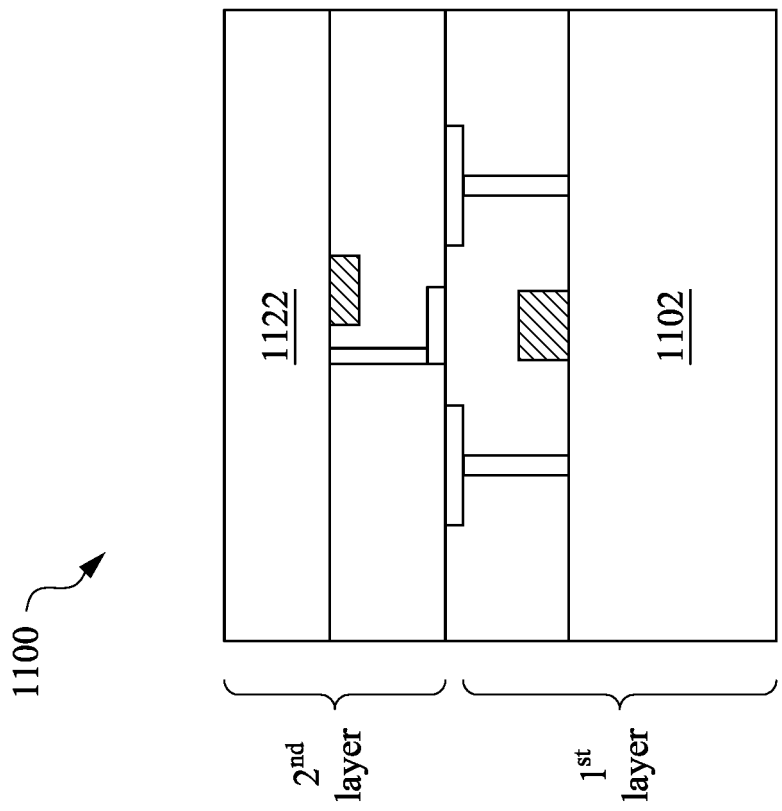

Corresponding to operation 1006 of FIG. 10, FIG. 11C illustrates a cross-sectional view of a portion of the semiconductor device 1100 in which the second substrate 1122 is thinned down from its back surface at one of the various stages of fabrication, in accordance with various embodiments. As shown, the second substrate 1122 is thinned down from its back surface. In some embodiments, the second substrate 1122 may be thinned down using a polishing process (e.g., a chemical-mechanical polishing (CMP) process), while having its front surface coupled to the first substrate 1102.

Corresponding to operation 1008 of FIG. 10, FIG. 11D illustrates a cross-sectional view of a portion of the semiconductor device 1100 including one or more TSVs 1134 at one of the various stages of fabrication, in accordance with various embodiments. As shown, the TSV 1134 can extend from the back surface of the thinned substrate 1122, through the thinned substrate 1122 and IMD/ILD 1130, and to the component 1108 of the first layer. Consequently, the second layer can be operatively coupled to the first layer through the TSVs 1134. The TSV 1134 can be formed through the same processes as the TSV 904, and have the same material as the TSV 904. Thus, the descriptions are not repeated.

Figure 11E:
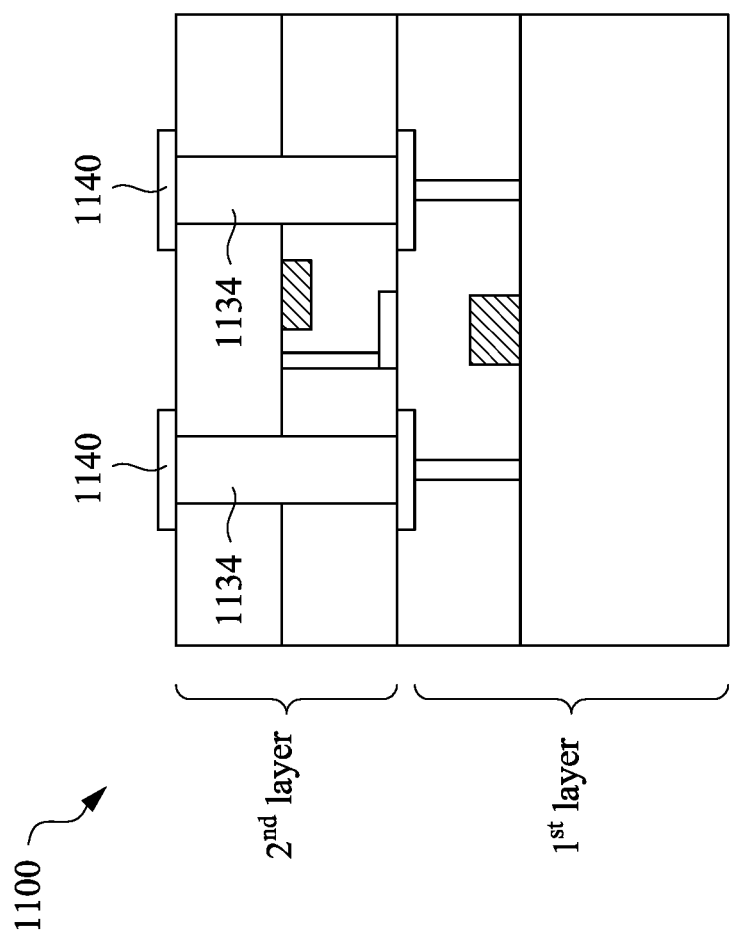

Corresponding to operation 1010 of FIG. 10, FIG. 11E illustrates a cross-sectional view of a portion of the semiconductor device 1100 including a number of bonding pads 1140 coupled to the TSVs 1134, respectively, at one of the various stages of fabrication, in accordance with various embodiments. The bonding pad 1140 can allow the TSV 1134 to be electrically coupled to other components such as, for example, one or more other layers to form one of the memory systems, as discussed above. The bonding pad 1140 is formed of a conductive material. The conductive material may comprise copper, although other suitable materials such as aluminum, alloys, doped polysilicon, combinations thereof, and the like, may alternatively be utilized.

Figure 12:
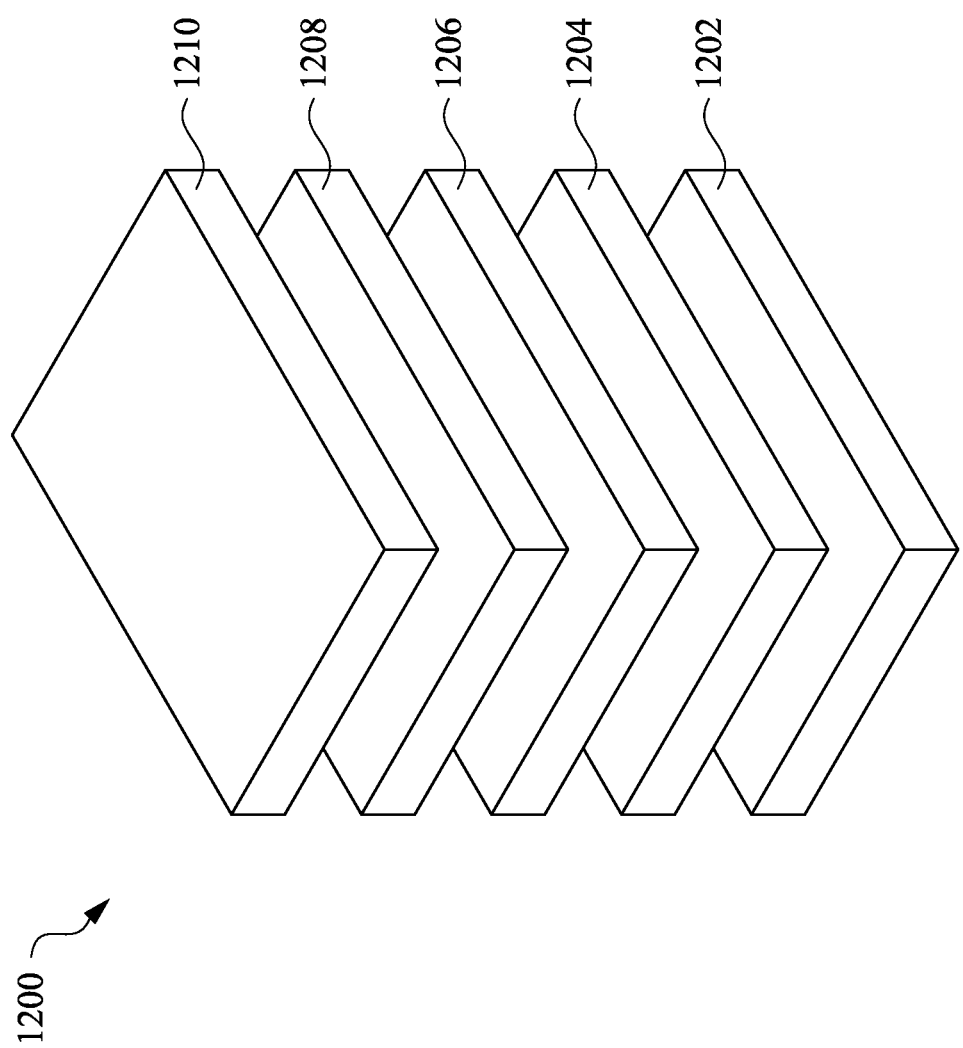
FIG. 12 illustrates a perspective view of a portion of a memory system that includes one or more components of FIG. 1, in accordance with some other embodiments.

FIG. 12 a perspective view of an example memory system 1200, in accordance with some other embodiments. The memory system 1200 includes a first layer 1202, a second layer 1204, a third layer 1206, a fourth layer 1208, and a fifth layer 1210. Different from the memory system discussed above, at least one the layers 1202 to 1210 may essentially consist of one or more memory arrays. In other words, essential circuits (e.g., row decoders, sensing circuits) of these memory arrays may be disposed in a different layer. For example, the layer 1202 may include a memory controller (e.g., 102 of FIG. 1), the layer 1204 may include some control circuits of a memory device (e.g., 106, 108, 110, 112, 114 of FIG. 1), the layer 1206 may include some decoders of a memory device (e.g., row decoders of 116, column decoders of 118 of FIG. 1), the layer 1208 may include some drivers or high-voltage circuits of a memory device (e.g., drivers of 116 of FIG. 1), and the layer 1210 may include some memory arrays of a memory device (e.g., 120 of FIG. 1). Further, a stacking sequence of these layers 1202 to 1210 can be changed in any manner, while remaining within the scope of the present disclosure.

In one aspect of the present disclosure, a memory device is disclosed. The memory device includes a first layer, wherein the first layer includes a first memory array, a first row decoder circuit, and a first column sensing circuit. The memory device includes a second layer disposed with respect to the first layer in a vertical direction. The second layer includes a first peripheral circuit operatively coupled to the first memory array, the first row decoder circuit, and the first column sensing circuit. The memory device includes a plurality of interconnect structures extending along the vertical direction. At least a first one of the plurality of interconnect structures operatively couples the second layer to the first layer.

In another aspect of the present disclosure, a memory device is disclosed. The memory device includes a first layer including a first memory array. The memory device includes a second layer including a second memory array. The memory device includes a third layer disposed with respect to the first and second layers in a vertical direction, wherein the third layer includes a plurality of peripheral circuits. The memory device includes a plurality of interconnect structures extending along the vertical direction, wherein at least a first one of the plurality of interconnect structures operatively couples the third layer to the first layer but not to the second layer, and at least a second one of the plurality of interconnect structures operatively couples the third layer to the second layer but not to the first layer.

In yet another aspect of the present disclosure, a method for fabricating a memory device is disclosed. The method includes providing a first layer including a first memory array, a first row decoder circuit, and a first column sensing circuit. The method includes providing a second layer vertically disposed with respect to the first layer and including a plurality of peripheral circuits. The method includes forming a plurality of through-silicon-via (TSV) structures, wherein at least a first one of the TSV structures is selected to operatively couple a first one of the plurality of peripheral circuits to the first memory array, the first row decoder circuit, and the first column sensing circuit.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a peripheral layer including a plurality of peripheral circuits;
a plurality of memory array layers disposed with respect to the peripheral layer in a vertical direction, each of the plurality of memory array layers corresponding to one of the plurality of peripheral circuits and including a respective memory array, a respective row decoder circuit, and a respective column sensing circuit; and
a plurality of interconnect structures fully extending across the peripheral layer and the memory array layers along the vertical direction, wherein at least a first one of the plurality of interconnect structures operatively couples the peripheral layer to a first one of the memory array layers but is operatively isolated from a second one of the memory array layers.

2. The memory device of claim 1, wherein a first one of the plurality of peripheral circuits is operatively coupled to the corresponding memory array, the corresponding row decoder circuit, and the corresponding column sensing circuit of the first memory array layer through the at least first interconnect structure.

3. The memory device of claim 1, wherein a second one of the plurality of peripheral circuits is operatively coupled to the corresponding memory array, the corresponding row decoder circuit, and the corresponding column sensing circuit of the second memory array layer through at least a second one of the plurality of interconnect structures.

4. The memory device of claim 3, wherein the second interconnect structure is operatively isolated from the first memory array layer.

5. The memory device of claim 1, wherein each of the memory array layers further includes a space area, and wherein the plurality of interconnect structures pass through the space area.

6. The memory device of claim 1, wherein the memory array of each of the memory array layers includes a dynamic random access memory (DRAM) array.

7. The memory device of claim 1, wherein the memory array of each of the memory array layers includes a resistive random access memory (RRAM) array.

8. The memory device of claim 1, wherein the memory array of each of the memory array layers includes a magnetoresistive random access memory (MRAM) array.

9. The memory device of claim 1, wherein the plurality of interconnect structures each include a through-silicon-via structure.

10. The memory device of claim 1, wherein the peripheral layer is disposed immediately below the first memory array layer without any other memory array layer interposed therebetween.

11. A memory device, comprising:
a peripheral layer including a plurality of peripheral circuits;
a plurality of memory array layers disposed with respect to the peripheral layer in a vertical direction, each of the plurality of memory array layers corresponding to one of the plurality of peripheral circuits and including a respective memory array, a respective row decoder circuit, and a respective column sensing circuit; and
a plurality of interconnect structures fully extending across the peripheral layer and the memory array layers along the vertical direction, wherein at least a first one of the plurality of interconnect structures operatively couples the peripheral layer to a first one of the memory array layers but is operatively isolated from a second one of the memory array layers;
wherein the plurality of interconnect structures each include a through-silicon-via structure.

12. The memory device of claim 11, wherein a first one of the plurality of peripheral circuits is operatively coupled to the corresponding memory array, the corresponding row decoder circuit, and the corresponding column sensing circuit of the first memory array layer through the at least first interconnect structure.

13. The memory device of claim 11, wherein a second one of the plurality of peripheral circuits is operatively coupled to the corresponding memory array, the corresponding row decoder circuit, and the corresponding column sensing circuit of the second memory array layer through at least a second one of the plurality of interconnect structures.

14. The memory device of claim 13, wherein the second interconnect structure is operatively isolated from the first memory array layer.

15. The memory device of claim 11, wherein each of the memory array layers further includes a space area, and wherein the plurality of interconnect structures pass through the space area.

16. The memory device of claim 11, wherein the memory array of each of the memory array layers includes a dynamic random access memory (DRAM) array.

17. The memory device of claim 11, wherein the memory array of each of the memory array layers includes a resistive random access memory (RRAM) array.

18. The memory device of claim 11, wherein the memory array of each of the memory array layers includes a magnetoresistive random access memory (MRAM) array.

19. A memory device, comprising:
a peripheral layer including a plurality of peripheral circuits;
a plurality of memory array layers disposed with respect to the peripheral layer in a vertical direction, each of the plurality of memory array layers corresponding to one of the plurality of peripheral circuits and including a respective memory array, a respective row decoder circuit, and a respective column sensing circuit; and
a plurality of interconnect structures fully extending across the peripheral layer and the memory array layers along the vertical direction, wherein at least a first one of the plurality of interconnect structures operatively couples the peripheral layer to a first one of the memory array layers but is operatively isolated from a second one of the memory array layers;
wherein a first one of the plurality of peripheral circuits is operatively coupled to the corresponding memory array, the corresponding row decoder circuit, and the corresponding column sensing circuit of the first memory array layer through the at least first interconnect structure;
wherein a second one of the plurality of peripheral circuits is operatively coupled to the corresponding memory array, the corresponding row decoder circuit, and the corresponding column sensing circuit of the second memory array layer through at least a second one of the plurality of interconnect structures.

20. The memory device of claim 19, wherein the second interconnect structure is operatively isolated from the first memory array layer.

* * * * *